US011156738B2

(12) United States Patent
Hou et al.

(10) Patent No.: US 11,156,738 B2
(45) Date of Patent: Oct. 26, 2021

(54) PERMEABILITY ANISOTROPY ASSESSMENT IN SUBSURFACE ANISOTROPIC FORMATIONS

(71) Applicant: Halliburton Energy Services, Inc., Houston, TX (US)

(72) Inventors: Junsheng Hou, Kingwood, TX (US); Natasa Mekic, Spring, TX (US); John Andrew Quirein, Georgetown, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 533 days.

(21) Appl. No.: 15/777,063

(22) PCT Filed: Jan. 25, 2016

(86) PCT No.: PCT/US2016/014679
§ 371 (c)(1),
(2) Date: May 17, 2018

(87) PCT Pub. No.: WO2017/131608
PCT Pub. Date: Aug. 3, 2017

(65) Prior Publication Data
US 2020/0309985 A1    Oct. 1, 2020

(51) Int. Cl.
*E21B 49/00* (2006.01)
*G01V 3/26* (2006.01)
(Continued)

(52) U.S. Cl.
CPC .............. *G01V 3/38* (2013.01); *E21B 47/26* (2020.05); *E21B 49/00* (2013.01);
(Continued)

(58) Field of Classification Search
CPC ...... E21B 2200/20; E21B 47/26; E21B 49/00; G01R 33/1223; G01V 11/00; G01V 3/18;
(Continued)

(56) References Cited

U.S. PATENT DOCUMENTS

| 5,663,499 A * | 9/1997 | Semmelbeck | G01V 3/38 166/250.02 |
| 7,157,915 B2 * | 1/2007 | Schoen | G01V 3/32 324/339 |

(Continued)

FOREIGN PATENT DOCUMENTS

| WO | WO 2015/051300 A1 | 4/2015 |
| WO | WO 2015/161282 A1 | 10/2015 |

OTHER PUBLICATIONS

Adams (MIT), 2013, Permeability anisotropy and resistivity anisotropy of mudrocks.
(Continued)

*Primary Examiner* — Jeffrey P Aiello
(74) *Attorney, Agent, or Firm* — Haynes and Boone, LLP

(57) ABSTRACT

Example embodiments are described for a method and system for logging data processing in determining permeability anisotropy effects. A permeability anisotropy model is used to derive a relationship between formation permeability anisotropy and resistivity anisotropy in both TI and BA formations. Implementations can provide the permeability anisotropy plus the true reservoir (or sand) permeability by using an integrated interpretation of the MCI resistivity anisotropy measurements with conventional permeability logs from other sensors (e.g., NMR or sonic). Biaxial and triaxial permeability components of the permeability anisotropy tensor can be determined for application to synthetic and field log interpretations.

18 Claims, 16 Drawing Sheets

(51) Int. Cl.
| | |
|---|---|
| *G01V 3/38* | (2006.01) |
| *G01V 3/32* | (2006.01) |
| *G01V 3/18* | (2006.01) |
| *E21B 47/26* | (2012.01) |
| *G01R 33/12* | (2006.01) |
| *G01V 3/34* | (2006.01) |
| *G01V 11/00* | (2006.01) |

(52) U.S. Cl.
CPC ........... *G01R 33/1223* (2013.01); *G01V 3/18* (2013.01); *G01V 3/26* (2013.01); *G01V 3/32* (2013.01); *G01V 3/34* (2013.01); *E21B 2200/20* (2020.05); *G01V 11/00* (2013.01)

(58) Field of Classification Search
CPC ... G01V 3/26; G01V 3/32; G01V 3/34; G01V 3/38
USPC .............. 73/152.01, 152.02, 152.24; 175/50; 324/303, 324; 702/6–7, 11–14; 703/2, 703/10
See application file for complete search history.

(56) References Cited

U.S. PATENT DOCUMENTS

| | | | |
|---|---|---|---|
| 2002/0101235 A1* | 8/2002 | Schoen | G01V 11/00 324/303 |
| 2004/0190589 A1* | 9/2004 | Zazovsky | E21B 49/00 374/136 |
| 2006/0241867 A1* | 10/2006 | Kuchuk | E21B 49/00 702/13 |
| 2009/0145600 A1 | 6/2009 | Wu et al. | |
| 2010/0004866 A1* | 1/2010 | Rabinovich | G01V 3/28 702/7 |
| 2010/0185424 A1* | 7/2010 | Massonnat | G01V 11/00 703/2 |
| 2010/0305927 A1* | 12/2010 | Suarez-Rivera | E21B 49/00 703/10 |
| 2014/0257706 A1* | 9/2014 | Biterge | G01V 3/18 702/13 |
| 2017/0363765 A1* | 12/2017 | Hou | E21B 47/092 |

OTHER PUBLICATIONS

Aldred, R.D., 2015, 3D petrophysical modeling to resolve complex reservoir interpretation problems: A case study from South East Asia: SPE 176243.
Georgi, D. et al., 2002, On the relationship between resistivity and permeability anisotropy: SPE 77715.
Hagiwara, T., 2015, To estimate permeability anisotropy from resistivity anisotropy: Resistivity SIG meeting in Apr. 22, 2015, Houston, USA.
International Search Report and The Written Opinion of the International Search Authority, or the Declaration, dated Sep. 12, 2016, PCT/US2016/014679, 11 pages, ISA/KR.
Klein et al., 1995, The petrophysics of electrically anisotropic reservoirs: SPWLA 36th Annual Logging Symposium, Paper HH.
Moran et al., EE, 1962, Theoretical analysis of pressure phenomena associated with wireline formation tester: Journal of petroleum technology, v14, 899-908.
Srisutthiyakorn et al., 2015, An improved Kozeny-Carman for irregular pore geometries: SEG extended abstract.
Tittman, 1990, Formation anisotropy: Reckoning with its effects. Schlumberger Oilfield Review, vol. 2(1), 16-23.
Wyllie et al., MB, 1952, Application of electrical resistivity measurements to problem of fluid flow in porous media: Bulletin of the American association of petroleum geologists: v36, 359-403.

* cited by examiner

PERMEABILITY ANISOTROPY ASSESSMENT IN SUBSURFACE ANISOTROPIC FORMATIONS

PRIORITY

The present application is a U.S. National Stage patent application of International Patent Application No. PCT/US2016/014679, filed on Jan. 25, 2016, the benefit of which is claimed and the disclosure of which is incorporated herein by reference in its entirety.

BACKGROUND

Modern operations for the exploration and production of oil and gas rely on access to a variety of information regarding subsurface geological parameters and conditions. Such information typically includes characteristics of Earth formations traversed by a borehole, as well as data relating to the size and mud of the borehole itself. The collection of information relating to subsurface conditions, which is commonly referred to as "logging," can be performed by several methods, including wireline logging and logging while drilling (LWD).

In wireline logging, a sonde is lowered into the borehole after some or all of the well has been drilled. The sonde hangs at the end of a wireline cable that provides mechanical support to the sonde and also provides an electrical connection between the sonde and electrical equipment located at the surface. In accordance with existing logging techniques, various parameters of the Earth's formations are measured and correlated with the position of the sonde in the borehole as the sonde is pulled uphole. In LWD, a drilling assembly includes sensing instruments that measure various parameters as the formation is penetrated, thereby enabling measurement of the formation during the drilling operation.

Among the available wireline and LWD tools are a variety of logging tools including devices configured for taking multicomponent induction (MCI), nuclear magnetic resonance (NMR), and multipole sonic logging (MSL) measurements. Formation permeability can be characterized using such measurements. Current models can be used for the determination of permeability in isotropic formations. However, formation permeability can exhibit anisotropy in anisotropic formations, and is often dependent upon the measuring direction of logging tools.

BRIEF DESCRIPTION OF THE DRAWINGS

Some embodiments are illustrated by way of example and not limitation in the figures of the accompanying drawings in which.

DETAILED DESCRIPTION

Figure 1:
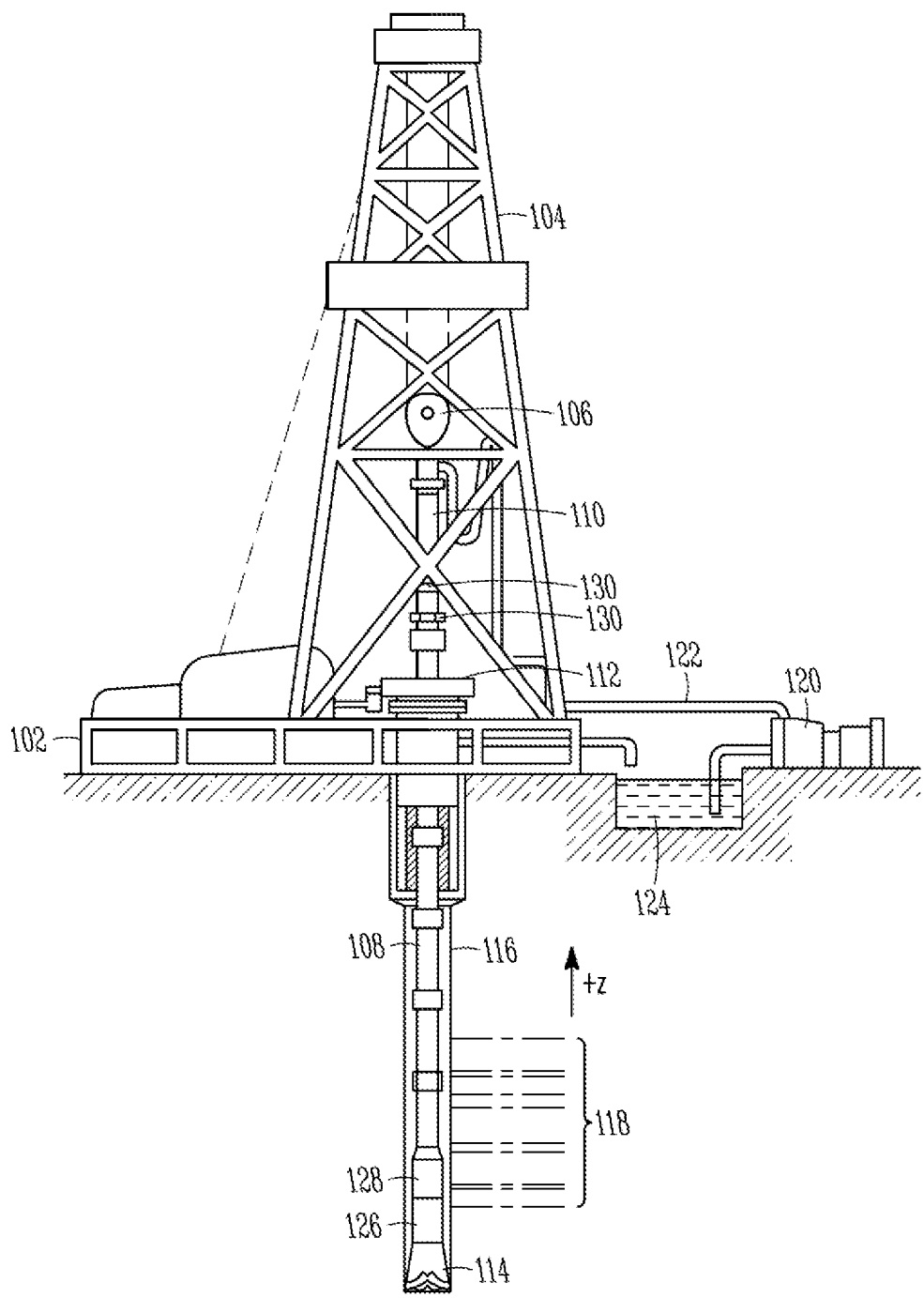
FIG. 1 is a schematic view of a system for capturing subsurface measurement data in a logging while drilling operation, according to one or more example embodiments.

The following detailed description refers to the accompanying drawings that depict various details of examples selected to show how aspects of this disclosure may be practiced. The discussion addresses various examples of the disclosed subject matter at least partially in reference to these drawings, and describes the depicted embodiments in sufficient detail to enable those skilled in the art to practice the subject matter disclosed herein. Many other embodiments may be utilized for practicing the disclosed subject matter other than the illustrative examples discussed herein, and structural and operational changes in addition to the alternatives specifically discussed herein may be made without departing from the scope of the disclosed subject matter.

INTRODUCTION

Subsurface formations can exhibit the ability to allow formations fluids (e.g., oil, water, or gas) or multi-phase fluids to pass through it, referred to as formation permeability. Formation permeability is an important parameter in formation evaluation and reservoir characterization. For example, permeability information can be utilized for reservoir simulation, enhanced oil recovery, well completion design, and field exploitation/development strategies. Unlike isotropic petro-physical parameters such as porosity and saturation, formation permeability can be anisotropic in, for example, three common types of subsurface formations (e.g., laminated sand-shale sequences, sands with different grain sizes, and sand with thin resistive/conductive streaks). Thus, permeability is often strongly dependent on the measuring direction in the anisotropic formations.

Various interpretation models for deriving formation permeability from logging data (e.g., multicomponent induction [MCI], nuclear magnetic resonance [NMR], and multipole sonic logging [MSL]) have been developed. However, such models can typically only be used for determining permeability in isotropic formations. Current logging tools and their measuring data can only be used for determination of scalar or isotropic permeability; however, these conventional log-derived permeabilities cannot deliver permeability anisotropy and its components (such as horizontal and vertical permeability). Accurate determination of permeability that accounts for anisotropy can enhance formation evaluation and reservoir characterization.

Permeability can be determined using a permeability anisotropy model that is based at least in part on relationship between formation permeability and resistivity in transversely isotropic (TI) and biaxially anisotropic (BA) formations. In MCI logging, formation resistivity (or conductivity, which is inversely related to resistivity) shows azimuthal anisotropy of horizontal resistivity in the bedding plane of formations. Unless the text or context clearly indicates otherwise, "horizontal" or "transverse" means a direction or plane substantially coinciding with a bedding plane of the relevant formation, and "vertical" means a direction of plane substantially orthogonal to the bedding plane of the relevant formation.

Processing of MCI logging data may be performed based at least in part on BA parameterization, resulting in more accurate description of complex anisotropic formations than is the case based on TI models. The TI formation model is a model that represents simulated formation resistivity characteristics accounting for transverse formation isotropy to resistivity. The TI model can account for resistivity differences between orthogonal axes lying in a formation or bedding plane (e.g., the horizontal or transverse plane) and an axis perpendicular to the formation or bedding plane (e.g., the vertical axis). Thus, the TI model accounts for anisotropy between the vertical axis and the horizontal plane, but assumes isotropy between different axes in the horizontal plane. The BA model additionally accounts for anisotropy between orthogonal axes in the transverse plane.

One or more example embodiments described below provide a method and system for logging data processing in determining permeability anisotropy. The description of example embodiments that follow describe using the permeability anisotropy model to derive a relationship between formation permeability anisotropy and resistivity anisotropy in both TI and BA formations. As is known, MCI tools are capable of measuring resistivity anisotropy in formations. An effective permeability or a permeability component can be used to calibrate conventional log-derived permeabilities (e.g., that only account for scalar or isotropic permeability) for calculating the other permeability components. The limited vertical resolution of logging tools are sometimes unable to capture the reservoir (or sand) permeability in laminar formations. Thus, in some embodiments, the sand permeability is determined from calculating horizontal and vertical permeability components based on a multi-modal permeability model, as discussed further below.

Implementations of the disclosed example embodiments can provide the permeability anisotropy by using an integrated interpretation of the MCI resistivity anisotropy measurements with conventional permeability logs from other sensors (e.g., resistivity, NMR, or sonic). Thus, biaxial (for TI formations) or triaxial (for BA formations) permeability components of the permeability anisotropy tensor can be determined and applied to field log interpretations.

Example Measurement Environments

FIG. 1 is a schematic illustration of an example logging while drilling (LWD) environment. A drilling platform 102 is equipped with a derrick 104 that supports a hoist 106 for raising and lowering a drill string 108. The hoist 106 suspends a top drive 110 suitable for rotating the drill string 108 and lowering the drill string 108 through the well head 112. Connected to the lower end of the drill string 108 is a drill bit 114. As the drill bit 114 rotates, it creates a borehole 116 that passes through various formations 118. A pump 120 circulates drilling fluid through a supply pipe 122 to top drive 110, down through the interior of drill string 108, through orifices in drill bit 114, back to the surface via an annulus around drill string 108, and into a retention pit 124. The drilling fluid transports cuttings from the borehole 116 into the pit 124 and aids in maintaining the integrity of the borehole 116. Various materials can be used for drilling fluid, including a salt-water based conductive mud.

An assembly of LWD tools 126 is integrated into a bottom-hole assembly (BHA) near the bit 114. As the bit 114 extends the borehole 116 through the formations 118, LWD tools 126 collect measurements relating to various formation properties as well as the tool orientation and various other drilling conditions. The LWD tools 126 may take the form of a drill collar, i.e., a thick-walled tubular that provides weight and rigidity to aid the drilling process. In various example embodiments, the LWD tools 126 include a multi-array triaxial induction tool to measure formation resistivity and deliver MCI measurement data (also referred to as "log data"), such as described further herein. Further, the LWD tools 126 can include a NMR and/or a sonic logging tool to measure and deliver logging data. A telemetry sub 128 may be included to transfer images and measurement data to a surface receiver 200 and to receive commands from the surface. In some embodiments, the telemetry sub 128 does not communicate with the surface, but rather stores logging data for later retrieval at the surface when the logging assembly is recovered.

Figure 2:
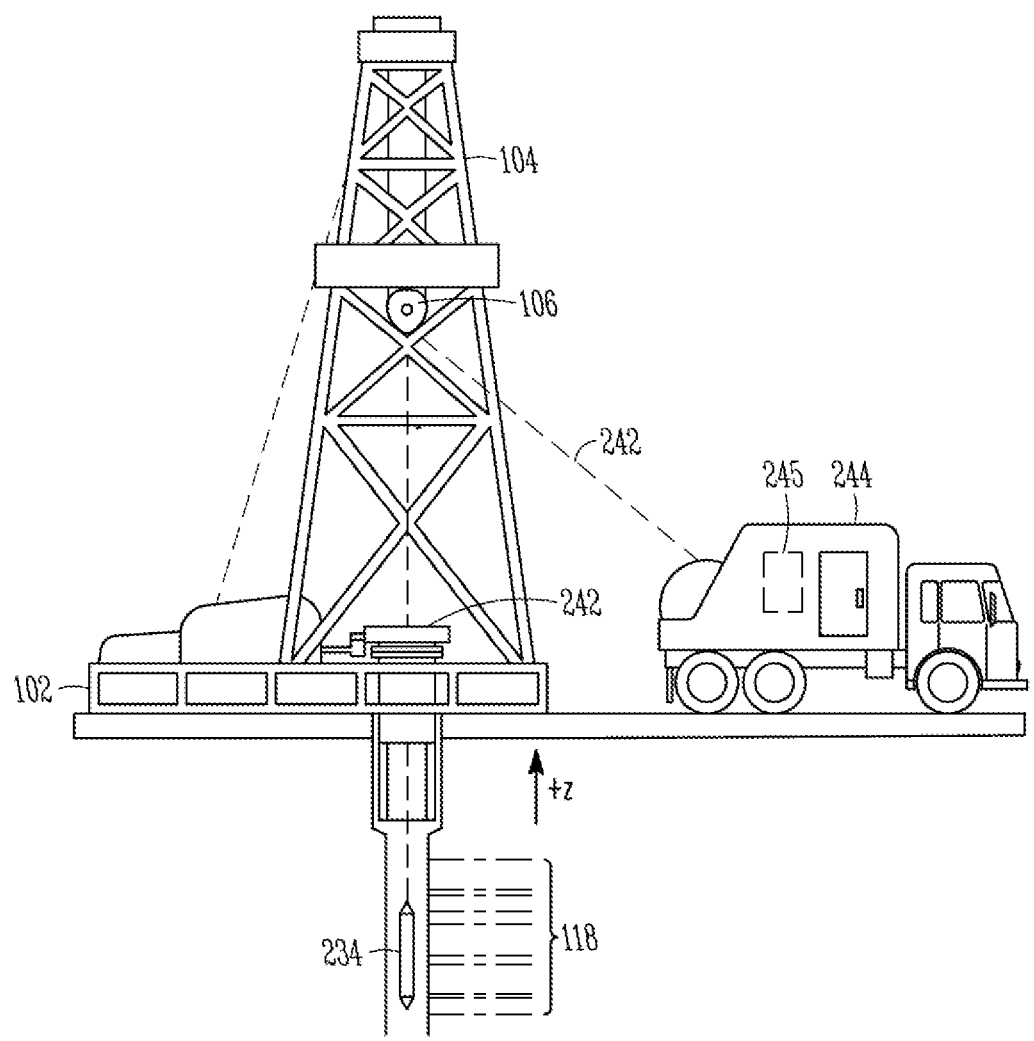
FIG. 2 is a schematic view of a system for capturing subsurface measurement data in a wireline logging operation, according to one or more example embodiments.

At various times during (or after) the drilling process, the drill string 108 may be removed from the borehole 116 as shown in FIG. 2. Once the drill string 108 has been removed, logging operations can be conducted using a wireline logging sonde 234, i.e., a probe suspended by a cable 242 having conductors for conducting power to the sonde 234, and for transmitting telemetry data from the sonde 234 to the surface. The example wireline logging sonde 234 may have pads and/or centralizing springs to maintain the sonde 234 near the central axis of the borehole 116 as sonde 234 is pulled uphole. The logging sonde 234 can include a variety of sensors including a multi-array triaxial induction tool for measuring formation resistivity and providing MCI measurement data. Further, the logging sonde 234 can include a NMR and/or sonic logging tool for measuring and providing measurement data. A logging facility 244 collects measurements from the logging sonde 234, and includes a computer system 245 for processing and storing the measurements gathered by the sensors.

Figure 3:
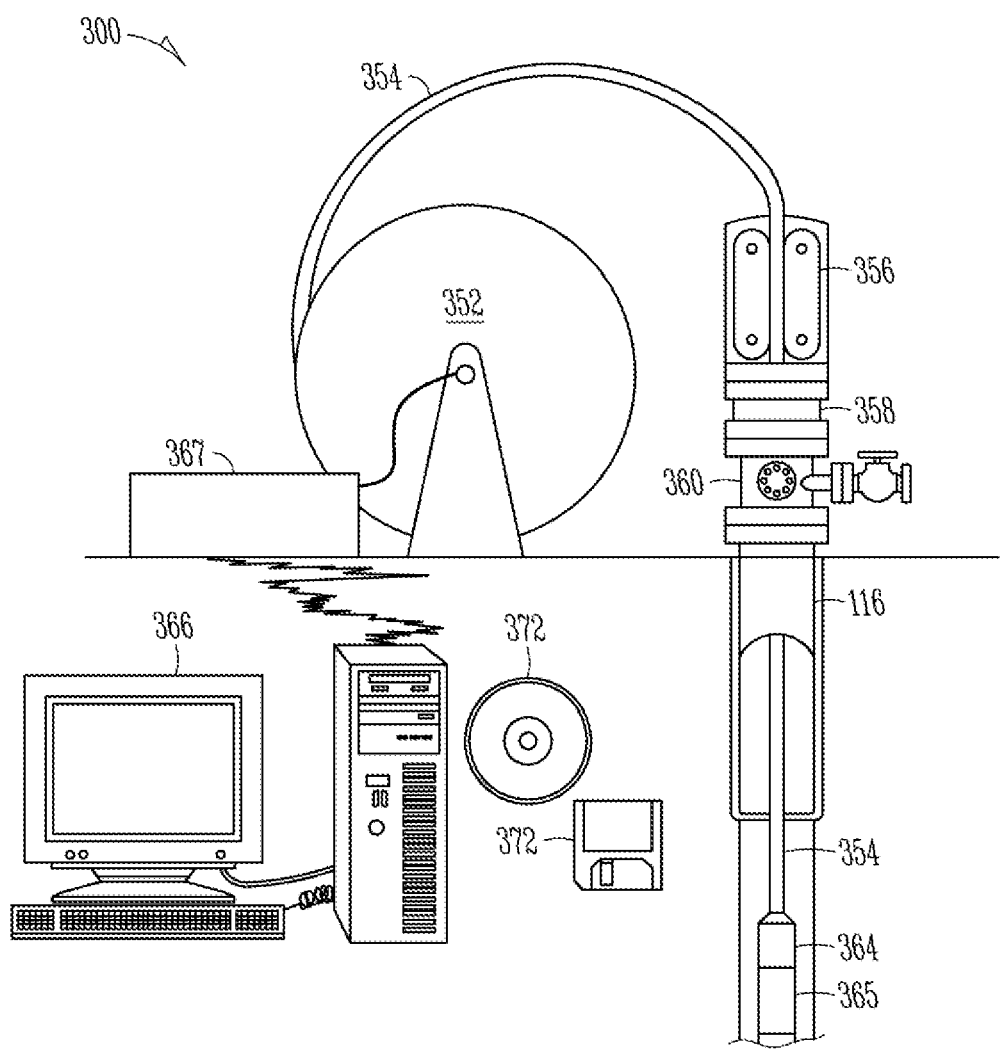
FIG. 3 is a schematic view of a coiled tubing logging system for capturing subsurface measurement data, according to one or more example embodiments.

Yet a further alternative logging technique is schematically illustrated in FIG. 3, which shows an example embodiment of a coiled tubing logging system 300. In system 300, coiled tubing 354 is pulled from a spool 352 by a tubing injector 356 and injected through a packer 358 and a blowout preventer 360 into the borehole 116. In the borehole 116, a supervisory sub 364 and one or more logging tools 365 are coupled to the coiled tubing 354 and configured to communicate to a surface computer system 366 via information conduits or other telemetry channels. An uphole interface 367 may be provided to exchange communications with the supervisory sub 364 and receive data to be conveyed to the surface computer system 366.

Surface computer system 366 is configured to communicate with supervisory sub 364 to set logging parameters and collect logging information from the one or more logging tools 365. Surface computer system 366 is configured by software (shown in FIG. 3 as being stored on example embodiments of removable storage media 372) to monitor and control downhole instruments 364, 365. The surface computer system 366 may be a computer system such as that described further herein.

Forward Models and Their Libraries

Forward modeling includes a numerical solution of Maxwell's equation in a mathematical boundary value problem, where the relevant formation or model specifies boundaries and shapes of regions of different resistivity. Processes for deriving formation parameters from a set of given field logs is known as inverse modeling, and typically comprises iteratively adjusting selected formation parameters in one or more layers of a formation model, and repeating forward modeling (e.g., by and the calculation or with reference to pre-calculated library data), until the observed field logs are satisfactorily replicated, e.g. until a set of variable borehole-formation parameters is found for a best fit with the observed log data based on the applicable formation model.

Some of the example processing schemes disclosed herein are based at least in part on a biaxial anisotropy (BA) model (otherwise known as orthorhombic anisotropy) and/or a transversely isotropic (TI) model. The TI model can account for resistivity differences between, on the one hand, orthogonal axes lying in a formation or bedding plane (sometimes referred to as the horizontal or transverse plane), and, on the other hand, an axis perpendicular to the formation or bedding plane (sometimes referred to as the vertical axis). The TI model thus can account for anisotropy between the "vertical" axis and the "horizontal" plane, but assumes isotropy between different axes in the "horizontal" or transverse plane. For this reason, the TI model is also referred to being TI anisotropic.

The BA model additionally accounts for anisotropy between orthogonal axes in the transverse plane, and is therefore also referred to as accounting for triaxial anisotropy. Note that, unless otherwise specified, "biaxial anisotropy" and its derivations refer to transverse biaxial anisotropy. Consistent with this terminology, a TI model does not account for biaxial anisotropy, even though it accounts for anisotropy between two axes (e.g., between the horizontal plane and the vertical axis).

We describe formation resistivity/conductivity of BA anisotropy in the formation's principal coordinate system. This system is chosen so that the x- or y-axis direction coincides with a conductivity tensor's principal axis having the largest conductivity (or smallest resistivity) component in the bedding plane; the z axis is parallel to the conductivity principal axis having the smallest conductivity component. In this principal axis coordinate system, the formation conductivity can be expressed as a diagonal tensor:

$$\bar{\sigma}_t = \text{diag}(C_x, C_y, C_z). \tag{1}$$

where $\bar{\sigma}$ is the formation conductivity tensor, its elements $C_x$ and $C_y$ are the two conductivities in the two principal-axis (e.g., x- and y-axes) in the bedding plane, and $C_z$ is the conductivity in the principal-axis direction perpendicular to the bedding plane.

If equation (1) is expressed in resistivity terms, the formation resistivity can be expressed as the following diagonal tensor:

$$\bar{R}_t = \text{diag}(R_x, R_y, R_z), \tag{2}$$

where $\bar{R}_t$ is the formation resistivity tensors, and its elements $R_x$, $R_y$, and $R_z$ are the triaxial resistivity components in the three principal-axis directions (xf, yf, and zf), respectively. It is noted that in a TI formation, resistivity can be represented as a diagonal tensor that is only described using two resistivity components: $R_h$ (wherein $R_h = R_x = R_y$) and $R_v$ (wherein $R_v = R_z$) in the principal axis system (e.g., x-y-z coordinate system), however, the resistivity tensor of the BA model is best described using the triaxial resistivity components: $R_x$, $R_y$, and $R_z$.

Based on equations (1) and (2), one can derive the relations among resistivity and conductivity components $R_x = 1/C_x$, $R_y = 1/C_y$, and $R_z = 1/C_z$. If $R_x = R_y = R_z$, then the formation resistivity is isotropic. If only $R_x = R_y \neq R_z$, then the formation resistivity is transversely isotropic; therefore, only one resistivity component is necessary in the bedding plane. In this case, both $R_x$ and $R_y$ are usually called horizontal resistivity and are often denoted as $R_h$ (=$R_x$=$R_y$); and, $R_z$ is called the vertical resistivity and is usually denoted as $R_v$. If $R_x \neq R_y \neq R_z$, the formation resistivity is of BA anisotropy. It is can be seen that the isotropy and transverse isotropy are only two special cases of the biaxial anisotropy. For the practical applications, different ratio notations are used. For example, ratios $R_{xy} = R_x/R_y$, or $R_{zx} = R_z/R_x$ and $R_{zy} = R_z/R_y$.

Permeability Model in Anisotropic Formations

As discussed herein, when permeability is anisotropic, a permeability tensor (as opposed to a scalar) is used for expressing the formation permeability. Pressure in formations can be applied in three directions, and for each direction, the permeability can be measured (via Darcy's law that describes the flow of a fluid through a porous medium) in three directions, thus leading to a 3 by 3 tensor. In a three-dimensional (3D) coordinate system, the tensor is realized using a 3 by 3 matrix being both symmetric and positive definite, and can be represented using the following equation:

$$K = \begin{pmatrix} k_{xx} & k_{xy} & k_{xz} \\ k_{xy} & k_{yy} & k_{yz} \\ k_{xz} & k_{yz} & k_{zz} \end{pmatrix} = (k_{ij})_{3 \times 3}. \tag{3}$$

In equation (3), K is the true formation permeability tensor, i denotes the pressure direction, and j is the permeability measurement direction. Therefore, component $k_{ij}$ represents the j-th directional permeability component at the i-th pressure direction. This permeability tensor K is diagonalizable (as it is both symmetric and positive definite). The eigenvectors will yield the principal directions of flow, representing the directions where flow is parallel to the pressure drop, and the three eigenvalues represent the three principal permeability components.

In the 3D principal coordinate system, the permeability tensor K is expressed as a diagonal tensor after the matrix diagonalization, which is equivalent to finding the matrix's eigenvalues, and can be represented using the following equation:

$$K=\mathrm{diag}(k_x,k_y,k_z) \quad (4)$$

In equation (4), $k_x$ and $k_y$ are the two permeability components in the two principal axis (X and Y) directions of the bedding plane, and $k_z$ is the permeability component in the Z principal axis direction perpendicular to the bedding plane. Following the formation resistivity descriptions, the formation permeability is isotropic if $k_x=k_y=k_z$. If $k_x=k_y\neq k_z$, then the permeability is transversely isotropic. In the TI formation, only two components are needed for describing the formation permeability anisotropy. In the bedding plane, the permeability component can be denoted as $k_x=k_y=k_h$ and is referred to as the horizontal permeability. For the Z-directional component, $k_z$, can be denoted as $k_z=k_v$ and is referred to as the vertical permeability. Thus, the permeability tensor can also be represented using the equation: K=diag ($k_h$, $k_h$, $k_v$). When $k_x \neq k_y \neq k_z$, the permeability is of biaxial anisotropy (BA).

In electrically anisotropic formations, the resistivity anisotropy can be obtained from the 3D induction resistivity logs, such as MCI logs. If formations are both permeability and resistivity anisotropic, the permeability anisotropy can be evaluated from the resistivity anisotropy. It is assumed that the pore space is represented as a bundle of independent and tortuous tubes of different radii in isotropic formations. If the flow rate is low enough that it is laminar and not turbulent, then the permeability scalar can be determined by using the following Kozeny-Carman equation:

$$k = A \cdot \frac{d^2}{4F} = A \cdot d^2 \cdot \frac{I \cdot R_w}{4R_t} \quad (5)$$

where k represents the permeability in an isotropic formation, A represents a shape factor for the pore tubes with a diameter of d, and F represents the formation factor.

The formation factor can be represented using the following equation:

$$F = \frac{R_o}{R_w} = \frac{R_t}{I \cdot R_w}, \quad (6)$$

where $R_o$ represents the 100% water-bearing formation resistivity, $R_w$ represents the formation water resistivity, $R_t$ represents the true formation resistivity, and I represents the resistivity index.

The resistivity index can be represented using the following equation:

$$I = \frac{R_t}{R_o} \quad (7)$$

In TI anisotropic formations, the permeability, formation factor, and resistivity (or conductivity) index are not scalars. Instead, the permeability, formation factor, and resistivity (or conductivity) index are represented using tensors, namely: K, F, and I, respectively. F and I can be represented using the following two diagonal tensor equations:

$$F=\mathrm{diag}(F_h,F_h,F_v) \quad (8)$$

$$I=\mathrm{diag}(I_h,I_h,I_v) \quad (9)$$

A generalization of all the values to anisotropic formation yields the tensor expressions. For example, the following equations represent permeability scalars in TI formations:

$$k_h = A_h \cdot d_h^2 \cdot \frac{1}{4F_h} = A_h \cdot d_h^2 \cdot \frac{I_h \cdot R_w}{4R_h} \quad (10)$$

$$k_v = A_v \cdot d_v^2 \cdot \frac{1}{4F_v} = A_v \cdot d_v^2 \cdot \frac{I_v \cdot R_w}{4R_v} \quad (11)$$

where $F_h$ and $F_v$ represent the formation factor components measured along the horizontal and vertical direction, respectively, which can be represented by $$F_h = \frac{R_h}{I_h \cdot R_w} \text{ and } F_v = \frac{R_v}{I_v \cdot R_w}.$$

The two components of the resistivity index tensor, I, can be represented by $$I_h = \frac{R_h}{R_O^h}, \text{ and } I_v = \frac{R_v}{R_O^v},$$

where $R_h$ and $R_v$ represent the formation horizontal and vertical resistivity, respectively.

Relationship Between Permeability Anisotropy and Resistivity Anisotropy

In TI permeability-anisotropic formations, the relationship between permeability and formation resistivity factor obtained along two perpendicular principal-axis directions can be represented using the following equation:

$$\frac{k_h}{k_v} = \frac{A_h \cdot d_h^2}{A_v \cdot d_v^2} \cdot \left(\frac{F_v}{F_h}\right) \quad (12)$$

Alternatively, the relationship between permeability and anisotropy and resistivity (or conductivity) anisotropy can be represented using the following equation:

$$\frac{k_h}{k_v} = \frac{A_h \cdot d_h^2}{A_v \cdot d_v^2} \frac{I_h}{I_v} \cdot \left(\frac{R_v}{R_h}\right) = \frac{A_h \cdot d_h^2}{A_v \cdot d} \frac{I_h}{I_v} \cdot \left(\frac{C_h}{C_v}\right) = C_{RP}\left(\frac{R_v}{R_h}\right) \quad (13)$$

where $$c_{RP} = \frac{A_h \cdot d_h^2}{A_v \cdot d_v^2} \frac{I_h}{I_v},$$

with $C_h$ and $C_v$ representing the horizontal and vertical conductivity, respectively. A resistivity (or conductivity) anisotropy ratio can be defined as:

$$R_{vh} = \frac{R_v}{R_h} = \frac{C_h}{C_v} = C_{vh},$$

and a permeability anisotropy ratio $k_{hv}$ can be defined as:

$$k_{hv} = \frac{k_h}{k_v}.$$

This permeability-resistivity anisotropy relationship shows that the permeability anisotropy can be evaluated based on resistivity anisotropy measurements (such as from MCI logs) and the pore shape/diameter. A simplified relationship between the permeability and resistivity anisotropy of equation (13) can be determined if it is assumed that $A_h I_h = A_v I_v$, and can be represented using the following equation:

$$\frac{k_h}{k_v} = \frac{d_h^2}{d_v^2} \cdot \left(\frac{R_v}{R_h}\right), \text{ or } k_{hv} = C_{RP} \cdot R_{vh}, \text{ or } R_{vh} = \frac{1}{C_{RP}} \cdot k_{hv} \quad (14)$$

Further, if it is assumed that $$C_{RP} = \frac{d_h^2}{d_v^2} = 1,$$

then equation (14) can further be reduced and represented using the following equation:

$$\frac{k_h}{k_v} = \left(\frac{R_v}{R_h}\right) \quad (15)$$

From equation (15), the permeability anisotropy can be estimated if the resistivity anisotropy is known, such as from MCI log inversion processing.

Determination of Permeability Tensor Components in TI Formations

An effective (or geometric mean) permeability as measured by a conventional formation logging tool can be represented using the following equation in TI formations:

$$k_e = \sqrt[3]{k_h^2 \cdot k_v} \quad (16)$$

The effective permeability, $k_e$, should fall between $k_h$ and $k_v$. It is noted that $k_h = k_v = k_e$ for isotropic media. For core measurements, it is possible to measure one permeability component or multi-component permeability, such as $k_h$ or $k_v$ or both components. In one case, if it is assumed that the log-derived permeabilities (e.g., using resistivity logs, sonic and/or NMR) are calibrated by $k_e$, then they are approximately equal to this effective permeability, $k_e$. In another case, if it is assumed that the log-derived permeabilities are calibrated by $k_h$ or $k_v$, then they are approximately equal to the horizontal or vertical permeability, $k_h$ or $k_v$.

For example, if it is assumed that the resistivity anisotropy can be obtained from the MCI resistivity measurements, then the horizontal and vertical permeabilities are determined from equations (15) and (16) if the log-derived permeabilities are equal to this effective permeability, $k_e$. Thus, the following equations can be used for determining $k_h$ and $k_v$:

$$k_h = k_e \cdot \sqrt[3]{k_{hv}} = k_e \cdot \sqrt[3]{R_{vh}} \quad (17)$$

$$k_v = \frac{k_e}{k_{hv}^{2/3}} = \frac{k_e}{R_{vh}^{2/3}} \quad (18)$$

Figure 4:
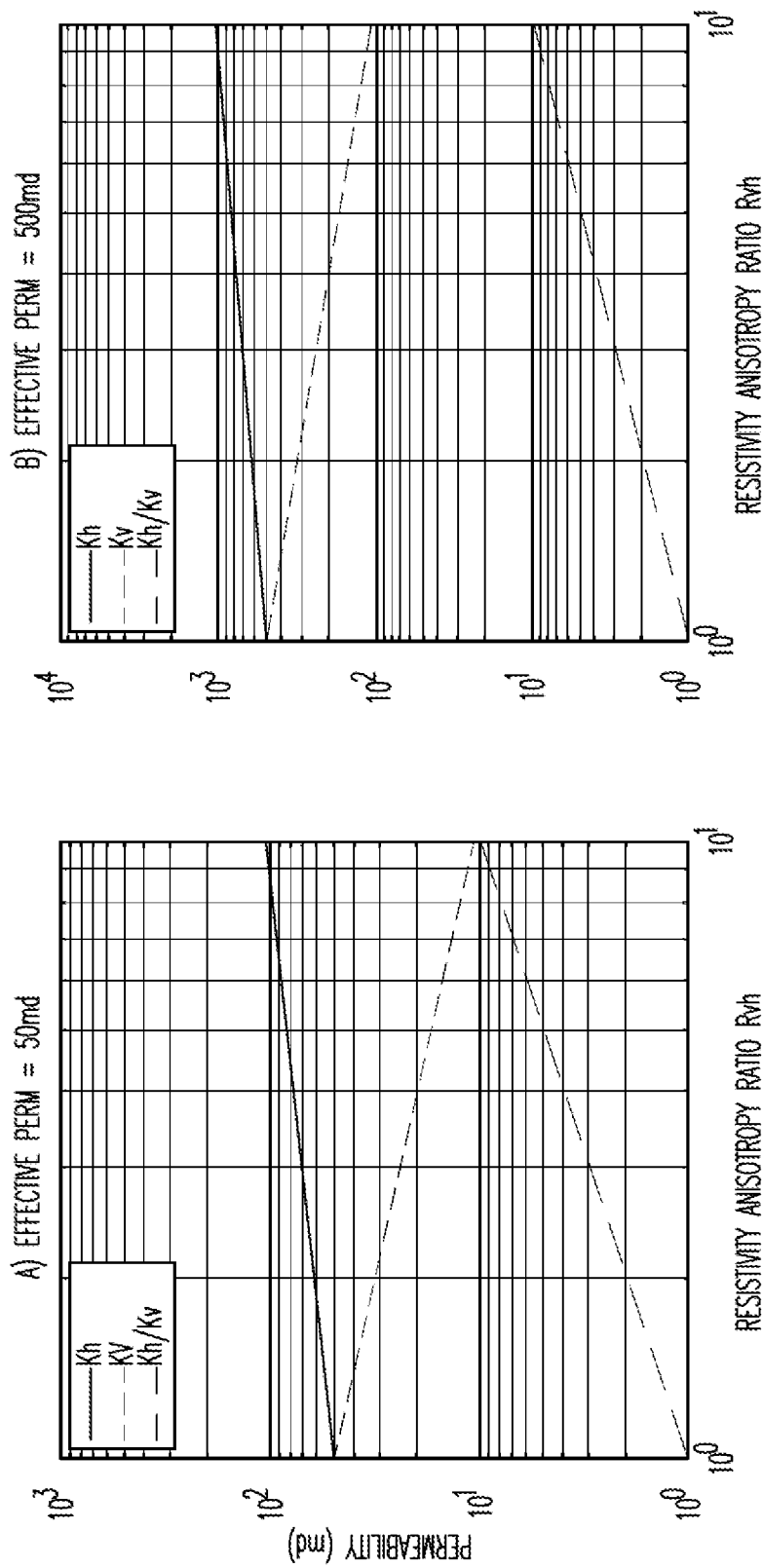
FIG. 4 is a pair of plot diagrams illustrating simulated results for permeability components, $k_h$ and $k_v$, and anisotropic ratio $k_{hv}$ as a function of the resistivity anisotropy ratio, according to one or more example embodiments.

FIG. 4 is a pair of plot diagrams illustrating simulated results for permeability components, $k_h$ and $k_v$, and anisotropic ratio $k_{hv}$ as a function of the resistivity anisotropy ratio, $R_{vh}$ using equations (17) and (18). The effective permeability is not equal to the horizontal and vertical permeabilities if $R_{vh} > 1$. Both $k_h$ and $k_v$ are two log-linear functions of $R_{vh}$. In the left plot, the effective permeability is 50 md. In the right plot, the effective permeability is 500 md. Therefore, after $k_h$ and $k_v$ are available, the permeability tensor K=diag($k_h$, $k_h$, $k_v$) can be determined.

True Permeability Determination in Laminar Reservoirs

Figure 5:
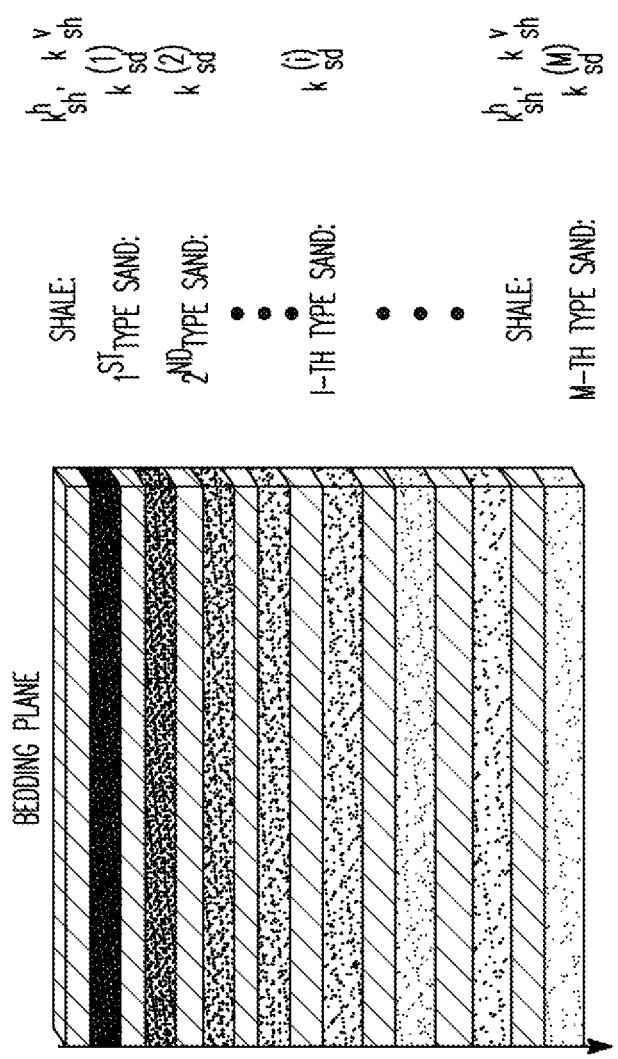
FIG. 5 is a diagram of a multi-component permeability model, according to one or more example embodiments.

It is known that the laminations in laminar reservoirs are often much thinner than a logging tool's vertical resolution. Therefore, the log-derived permeabilities can be represented as weighted averages of true reservoir permeability and shale permeability. FIG. 5 is a diagram of a multi-component permeability model consisting of M-number types of isotropic sands and one TI shale. In the model, $k_{sd}^{(i)}$ is the i-th type true or sand permeability, and $k_{sh}^h$ and $k_{sh}^v$ represent the horizontal and vertical permeabilities of the pure shale formation. According to the multi-component permeability model, the following equations can be used for determination of true reservoir permeability in a laminar formation, such as sand-shale formations:

For permeability in a direction parallel (e.g., horizontal) to the bedding plane, the horizontal permeability can be represented using the following equation:

$$k_h = \Sigma_{i=1}^M (V_{sd}^{(i)} \cdot k_{sd}^{(i)}) + k_{sh}^h \cdot \Sigma_{i=1}^M V_{lam}^{(i)} = \Sigma_{i=1}^M (V_{sd}^{(i)} \cdot k_{sd}^{(i)}) + k_{sh}^h \cdot V_{lam} \quad (19)$$

For permeability in a direction perpendicular (e.g., vertical) to the bedding plane, the vertical permeability can be represented using the following equation:

$$\frac{1}{k_v} = \sum_{i=1}^M \left(\frac{V_{sd}^{(i)}}{k_{sd}^{(i)}}\right) + \frac{\sum_{i=1}^M V_{lam}^{(i)}}{k_{sh}^v} = \sum_{i=1}^M \left(\frac{V_{sd}^{(i)}}{k_{sd}^{(i)}}\right) + \frac{V_{lam}}{k_{sh}^v} \quad (20)$$

In equations (19) and (20), it is assumed that all sands are isotropic and the shale is TI anisotropic. M represents the total number of the sand types. $k_{sh}^h$ and $k_{sh}^v$ represent the horizontal and vertical permeabilities of the pure shale formation, respectively. $V_{lam} = \Sigma_{i=1}^M V_{lam}^{(i)}$ represents the total laminated shale volume fraction, $V_{sd}^{(i)}$ represents the volume percentage for the i-th type sand or reservoir, $k_{sd}^{(i)}$ represents the i-th type sand permeability, and $\Sigma_{i=1}^M (V_{sd}^{(i)}) + V_{lam} = 1$.

Figure 6:
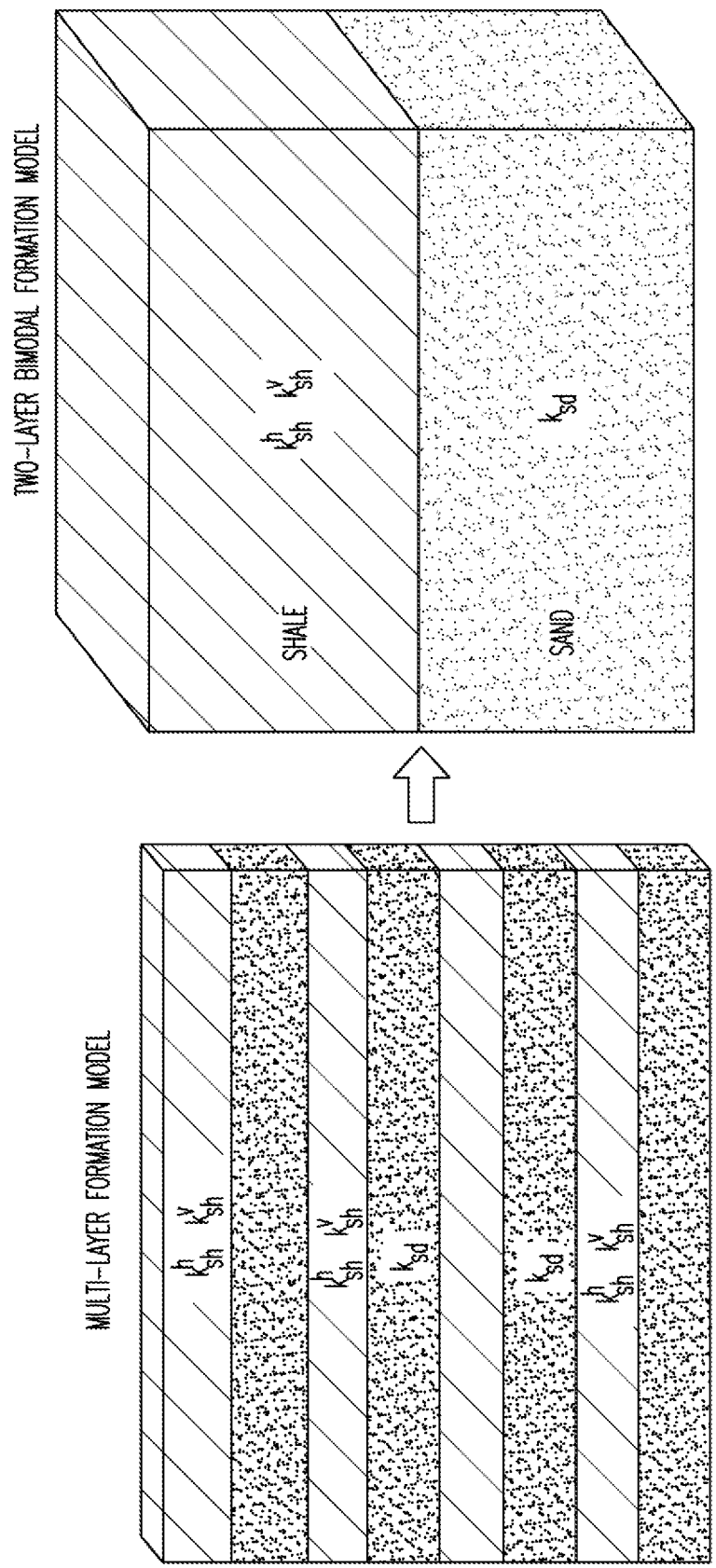
FIG. 6 is a diagram illustrating a bimodal permeability model consisting of isotropic sand and transversely isotropic shale, according to one or more example embodiments.

If it is assumed that M=1 or $k_{sd}^{(1)} = k_{sd}^{(2)} = \ldots = k_{sd}^{(M)} = k_{sd}$, the above equations can be reduced to a bimodal permeability model for determination of reservoir permeability. FIG. 6 is a diagram illustrating a bimodal permeability model consisting of isotropic sand and TI shale. Here, $k_{sd}$ is the true sand (or reservoir) permeability, and $k_{sh}^h$ and $k_{sh}^v$ are the horizontal and vertical permeabilities of the pure shale formation. As illustrated, a multi-layer model can be reduced to an equivalent two-layer bimodal model.

The horizontal permeability component can be represented using the following reduced equation:

$$k_h = (1 - V_{lam}) \cdot k_{sd} + V_{lam} \cdot k_{sh}^h \quad (21)$$

The vertical permeability component can be represented using the following reduced equation:

$$\frac{1}{k_v} = \frac{(1 - V_{lam})}{k_{sd}} + \frac{V_{lam}}{k_{sh}^v}, \text{ or } k_v = \frac{1}{\frac{(1 - V_{lam})}{k_{sd}} + \frac{V_{lam}}{k_{sh}^v}} \quad (22)$$

Figure 7:
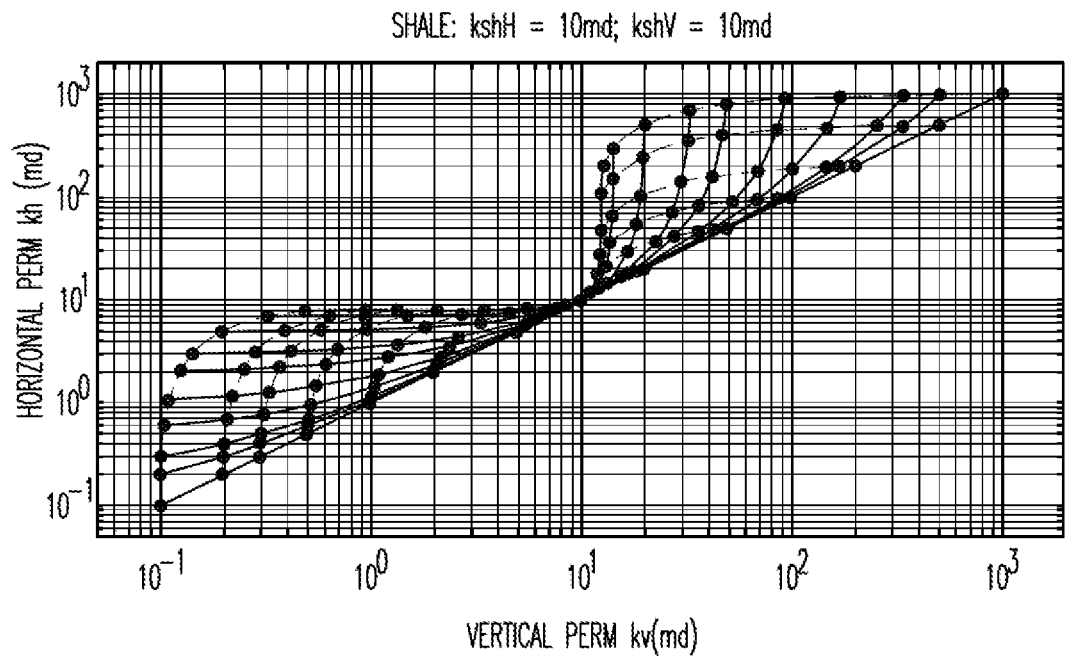
FIG. 7 is a plot diagram of an example graphical solution for sand permeability $k_{sd}$ and laminar shale volume $V_{lam}$ in laminar formations, according to one or more example embodiments.
Figure 8:
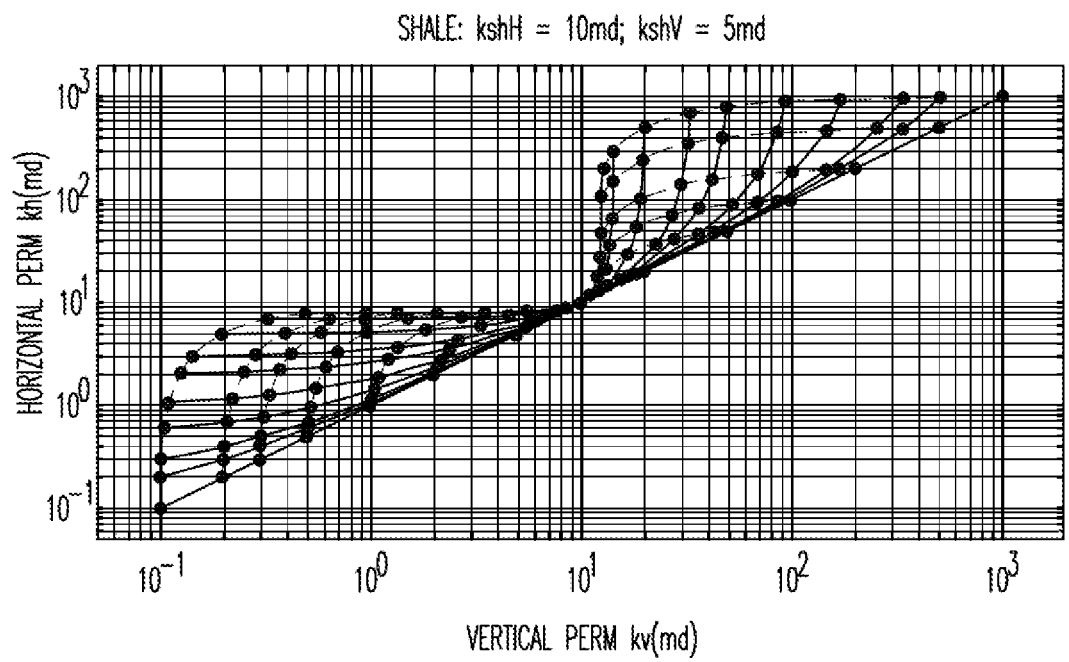
FIG. 8 is plot diagram of another example graphical solution for sand permeability $k_{sd}$ and laminar shale volume $V_{lam}$ in laminar formations, according to one or more example embodiments.

In equations (21) and (22), if $k_h$, $k_v$, $k_{sh}^h$ and $k_{sh}^v$ are known, then the sand permeability $k_{sd}$ and $V_{lam}$ can be solved. For example, the graphical solution of sand permeability $k_{sd}$ and laminar shale volume $V_{lam}$ to equations (21) and (22) for laminar shale at $k_{sh}^h=10$ md and $k_{sh}^v=10$ md are shown in FIG. 7. In FIG. 7, the dashed-line contours correspond to values of constant $V_{lam}$, and the solid-line contours represent values of constant $k_{sd}$. Similarly, FIG. 8 illustrates a graphical solution for $k_{sh}^h=10$ md and $k_{sh}^v=5$ md. In FIG. 8, the dashed-line contours correspond to values of constant $V_{lam}$, and the solid-line contours represent values of constant $k_{sd}$.

However, if it is assumed that both sand and shale are isotropic (e.g., $k_{sh}^h = k_{sh}^v = k_{sh}$), equations (21) and (22) can be expressed using the following equations:

$$k_h = (1 - V_{lam}) \cdot k_{sd} + V_{lam} \cdot k_{sh} \quad (23)$$

$$\frac{1}{k_v} = \frac{(1 - V_{lam})}{k_{sd}} + \frac{V_{lam}}{k_{sh}}, \text{ or } k_v = \frac{1}{\frac{(1 - V_{lam})}{k_{sd}} + \frac{V_{lam}}{k_{sh}}} \quad (24)$$

Figure 9:
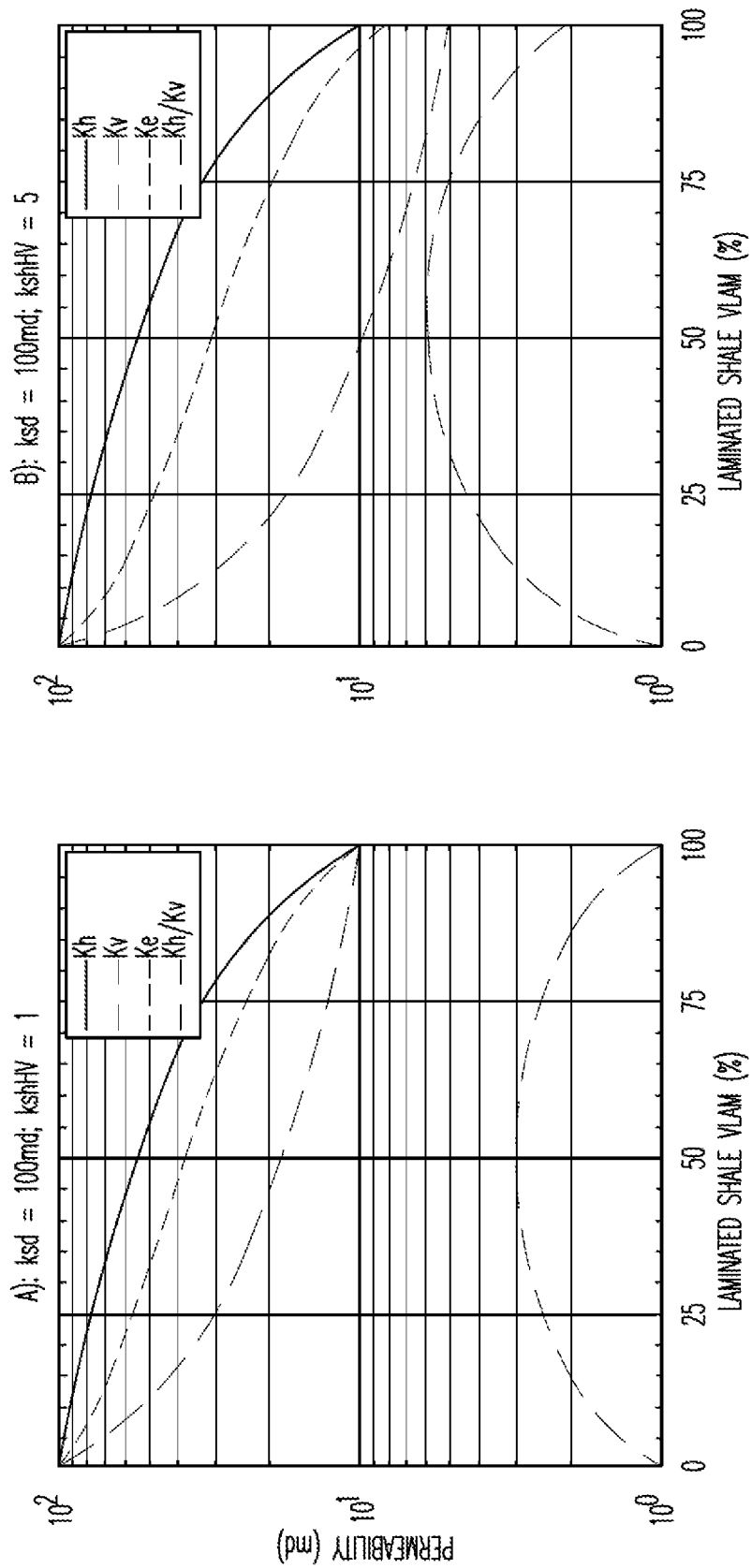
FIG. 9 is a pair of plots illustrating horizontal and vertical permeability, $k_h$ and $k_v$, effective permeability $k_e$, and anisotropic ratio $k_{hv}=k_h/k_v$ as a function of laminar shale volume $V_{lam}$, according to one or more example embodiments.
Figure 10:
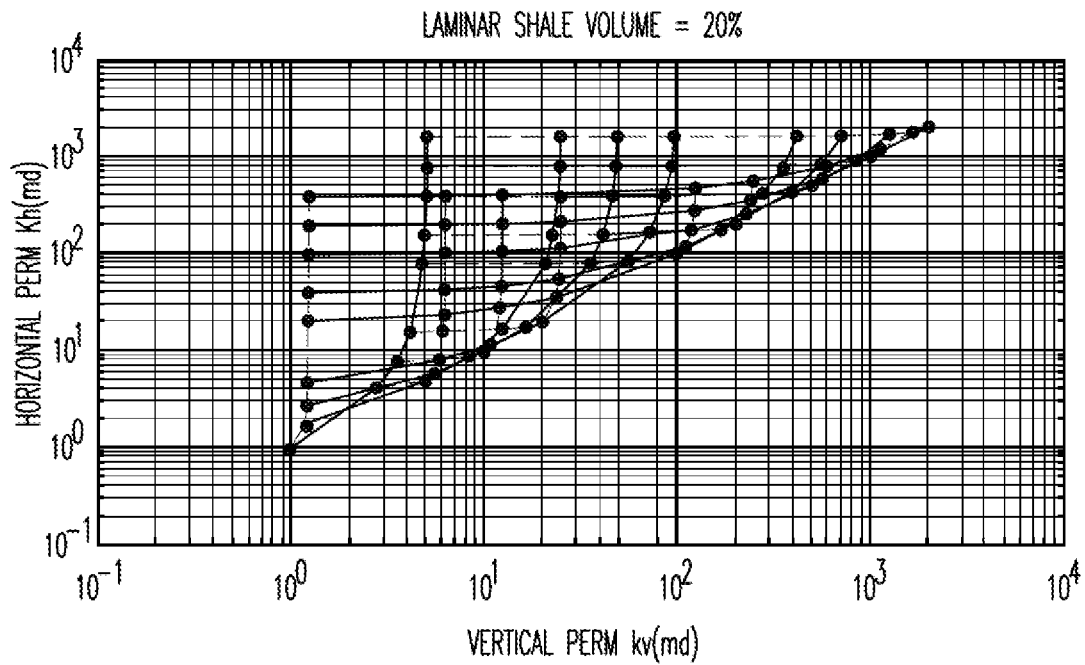
FIG. 10 is a plot diagram illustrating a graphical solutions for $k_{sd}$ and $k_{sh}$ to at a laminar shale volume of $V_{lam}=20\%$, according to one or more example embodiments.

However, even though it is assumed that both the sand and shale are isotropic, the macro anisotropy of formation permeability can be observed. For example, FIG. 9 is a pair of plots illustrating horizontal and vertical permeability, $k_h$ and $k_v$, effective permeability $k_e$, and anisotropic ratio $k_{hv}=k_h/k_v$ as a function of laminar shale volume $V_{lam}$. If $V_{lam} \neq 0$, $k_{sd}$ and $k_{sh}$ represent the sandstone and shale permeability, respectively. If it is assumed that the two permeability components, $k_h$, $k_v$, and laminar shale volume $V_{lam}$ are known, then $k_{sd}$ and $k_{sh}$ can be resolved from equations (23) and (24). After the lamination effects on the measured/calculated permeabilities, $k_h$, $k_v$, are corrected, the more accurate permeability $k_{sd}$ for sand can be obtained. In FIG. 9, the sandstone permeability $k_{sd}=100$ md and $k_{sh}^h=10$ md. The left plot has shale permeability kshHV=$k_{sh}^v$=1 or the shale is isotropic. The right plot has shale permeability kshHV=$k_{sh}^v$=5 or the shale is TI anisotropic. These plots show that the $k_{hv}$ approaches the maximum value at approximately 50% shale by volume. FIG. 10 is a plot diagram illustrating a graphical solutions for $k_{sd}$ and $k_{sh}$ to Equations (23) and (24) at a laminar shale volume of $V_{lam}=20\%$. In FIG. 10, the solid-line contours correspond to values of constant $k_{sh}$, and the dashed-line contours represent values of constant $k_{sd}$.

Using equations (23) and (24), the permeability anisotropy ratio $$k_{hv} = \frac{k_h}{k_v}$$

can be represented using the following equation:

$$k_{hv} = \frac{k_h}{k_v} = [(1 - V_{lam}) \cdot k_{sd} + V_{lam} \cdot k_{sh}] \frac{(1 - V_{lam})}{k_{sd}} + \frac{V_{lam}}{k_{sh}} = \\ 1 + V_{lam}(1 - V_{lam}) \cdot \left[ \frac{k_{sd}}{k_{sh}} + \frac{k_{sh}}{k_{sd}} - 2 \right] \quad (25)$$

Further, the following equations can be used for calculating $R_h$ and $R_v$:

$$\frac{1}{R_h} = \frac{(1 - V_{lam})}{R_{sd}} + \frac{V_{lam}}{R_{sh}^h} \quad (26)$$

$$R_v = (1 - V_{lam}) \cdot R_{sd} + V_{lam} \cdot R_{sh}^v \quad (27)$$

If $R_{sh}^h = R_{sh}^v = R_{sh}$, the following resistivity anisotropy ratio occurs:

$$R_{vh} = \frac{R_v}{R_h} = 1 + V_{lam}(1 - V_{lam}) \cdot \left[ \frac{R_{sd}}{R_{sh}} + \frac{R_{sh}}{R_{sd}} - 2 \right] \quad (28)$$

From the above, it can be observed that: if $$\frac{k_{sd}}{k_{sh}} = \frac{R_{sd}}{R_{sh}},$$

then $k_{hv}=R_{vh}$ (or $C_{RP}=1$). Otherwise, $k_{hv}=C_{RP} \cdot R_{vh}$, and $C_{RP}$ is a non-linear function of $V_{lam}$, $k_{sd}/k_{sh}$, and $R_{sd}/R_{sh}$, and can be represented using the following equation:

$$C_{RP} = \frac{1 + V_{lam}(1 - V_{lam}) \cdot \left[ \frac{k_{sd}}{k_{sh}} + \frac{k_{sh}}{k_{sd}} - 2 \right]}{1 + V_{lam}(1 - V_{lam}) \cdot \left[ \frac{R_{sd}}{R_{sh}} + \frac{R_{sh}}{R_{sd}} - 2 \right]} \quad (29)$$

Figure 11:
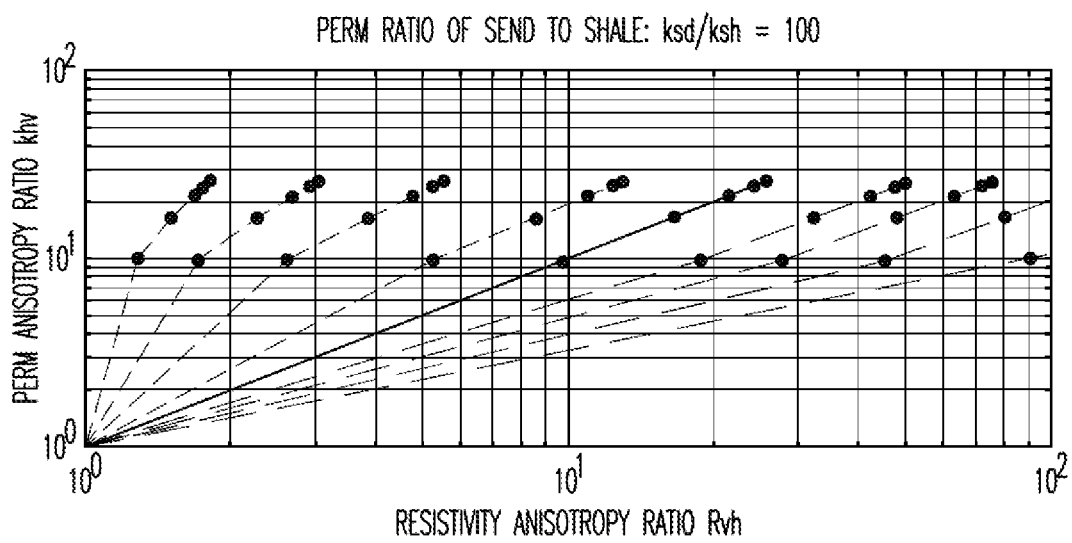
FIG. 11 is a plot diagram illustrating simulated results for permeability anisotropy ratio $k_{hv}$ as a function of resistivity anisotropy ratio $R_{vh}$, according to one or more example embodiments.

Once all of $V_{lam}$, $$\frac{k_{sd}}{k_{sh}}, \text{ and } \frac{R_{sd}}{R_{sh}}$$

are known, equation (29) can be used to estimate $C_{RP}$. FIG. 11 is a plot diagram illustrating simulated results for permeability anisotropy ratio $k_{hv}$ as a function of resistivity anisotropy ratio $R_{vh}$ using equations (25) and (28). In FIG. 11, $$\frac{k_{sd}}{k_{sh}} = 100,$$

the dashed lines above the solid line have values of:

$$\frac{R_{sd}}{R_{sh}} = 1, 5, 10, 20,$$

and 50 from left to right; blue solid line has a value of:

$$\frac{R_{sd}}{R_{sh}} = 100;$$

the dashed lines below the solid line have values of:

$$\frac{R_{sd}}{R_{sh}} = 200, 300, 500,$$

and 1000 from left to right; and $V_{lam}$=0–0.8. FIG. 11 provides a graphical solution to $C_{RP}$, and illustrates a log-linear correlation between $k_{hv}$ and $R_{vh}$ if both ratios are less than 10, or $C_{RP}$ is not sensitive to $V_{lam}$.

Permeability Anisotropy Determination in BA Formations

Equations similar to those previously discussed with regard to equations (15) and (16) for TI formations can be inferred for BA formations and represented using the following equations:

$$k_{xz} = \frac{k_x}{k_z} = \left(\frac{R_z}{R_x}\right) = R_{zx} \quad (30)$$

$$k_{yz} = \frac{k_y}{k_z} = \left(\frac{R_z}{R_y}\right) = R_{zy} \quad (31)$$

$$k_{yx} = \frac{k_y}{k_x} = \left(\frac{R_x}{R_y}\right) = R_{xy} \quad (32)$$

$$k_e^{BA} = \sqrt[3]{k_x \cdot k_y \cdot k_z} \quad (33)$$

where $R_{zy}=R_{zx} \cdot R_{xy}$. Once the triaxial resistivity components ($R_x$, $R_y$, and $R_z$) and the effective permeability $k_e^{BA}$ or one permeability component such as $k_x$ are available, then the tri-axial permeability components ($k_x$, $k_y$, and $k_z$) and permeability anisotropy $$\left(\text{e.g., } \frac{k_x}{k_y}, \text{ and } \frac{k_y}{k_z}\right)$$

can be obtained.

For example, if $k_e^{BA}$ and the resistivity anisotropy ratios are known, then equation (33) can be solved for the following:

$$k_x = k_e^{BA} \cdot \left(\frac{R_{zx}}{R_{xy}}\right)^{1/3} \quad (34)$$

$$k_y = k_e^{BA} \cdot (R_{xy} \cdot R_{zy})^{1/3} \quad (35)$$

$$k_z = \frac{k_e^{BA}}{(R_{xy} \cdot R_{zy})^{1/3}} \quad (36)$$

Figure 12:
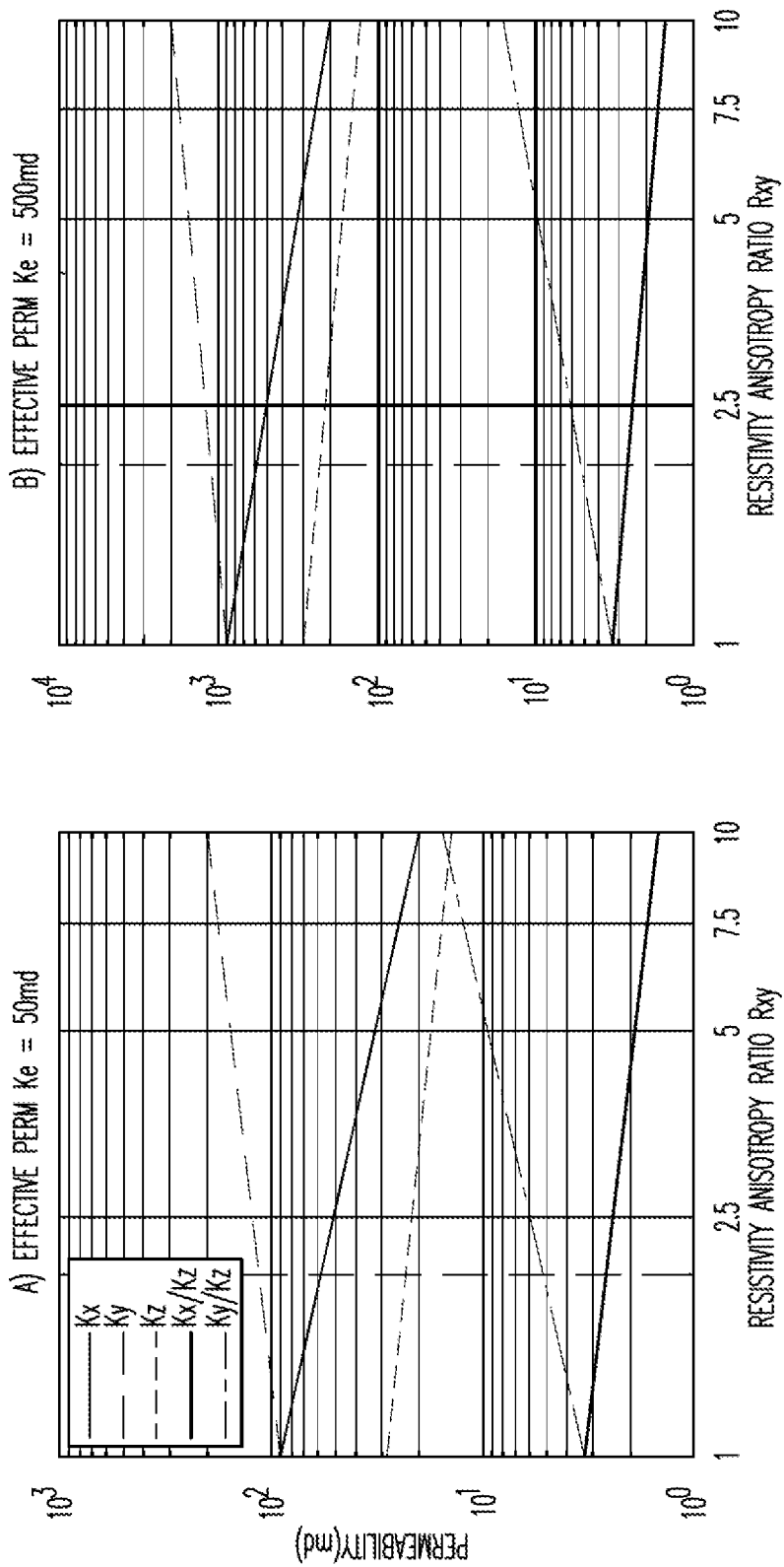
FIG. 12 is a pair of plot diagrams illustrating simulated results for triaxial permeability components, $k_x$, $k_y$, and $k_z$, as a function of the resistivity anisotropy ratio, $R_{xy}$, according to one or more example embodiments.

FIG. 12 is a pair of plot diagrams illustrating simulated results for triaxial permeability components, $k_x$, $k_y$, and $k_z$, as a function of the resistivity anisotropy ratio, $R_{xy}$, by using equations (34)-(36). In FIG. 12, $R_{zy}$=6, and two effective permeability plots are displayed. As illustrated, $k_x$, $k_y$, and $k_z$, are three log-linear functions of horizontal resistivity anisotropy ratio, $R_{xy}$. The left plot diagram has effective permeability $k_e$=50 md and the right plot diagram has effective permeability $k_e$=500 md. It is noted that the plot diagrams of FIG. 12 (e.g., for a biaxial anisotropic formation) is similar to those of FIG. 4 (e.g., for a TI anisotropic formation).

Workflow for Prediction of Permeability Anisotropy

Figure 13:
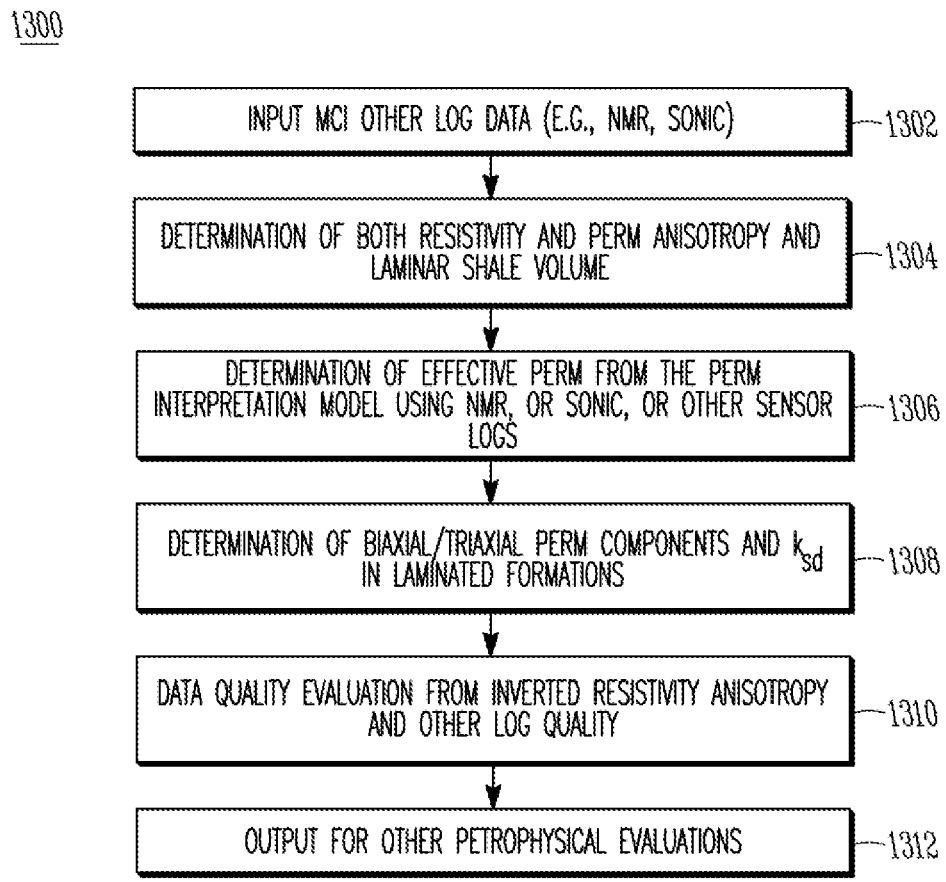
FIG. 13 is flow chart illustrating a method for evaluation of formation permeability anisotropy, according to one or more example embodiments.

FIG. 13 is a flow chart illustrating a method 1300 comprising multi-level data processing based on multiple forward models with BA and TI anisotropies. The method 1300 provides for evaluation of formation permeability anisotropy using an integration of MCI log data with other sensor logs (e.g., NMR, sonic, or other logging tools).

At operation 1402, MCI measurement data captured by a triaxial MCI tool in a borehole extending through a subsurface geological formations is inputted after calibration, temperature correction and other preprocessing. This preprocessing does not include skin-effect correction. The MCI data may be multi-frequency data, and may be taken at multiple spacings. In some embodiments, the MCI measurement data can be single-frequency measurements for the respective arrays of the tool. Further, other log data captured by, for example, sonic or NMR logging tools are also inputted.

At operation 1304, inversion processing is applied to MCI measurement data to produce inverted parameters to be used for permeability evaluation. For example, a TI-based inversion can be applied to produce the inverted TI parameters of $R_h$ and $R_v$. Further, a BA-based inversion can be applied to produce the inverted BA parameters of $R_x$, $R_y$, and $R_z$. Each of these TI- and BA-based inversion processings can be based on various formation models, including, but not limited to: radially one-dimensional (R1D) and zero-dimensional (0D) models. The inverted parameters can be used for the determination of, for example, the resistivity anisotropy ($R_{vh}$). The permeability anisotropy ratio ($k_{hv}$) can be determined from the resistivity anisotropy using, for example, equations (12)-(15) as discussed above. Operation 1304 can further include determining the laminar shale volume $V_{lam}$.

At operation 1306, the effective permeability $k_e$ (or a permeability component) can be determined using conventional log-derived permeabilities (e.g., using NMR, sonic, or resistivity logs). At operation 1308, permeability components can be determined using resistivity anisotropy data obtained from MCI resistivity measurement data and the effective permeability $k_e$ from conventional permeability logs. In one embodiment, equations (17)-(18) as discussed above can be used for determining the permeability components, $k_h$ and $k_v$, in TI formations. The permeability components can be used to solve equations (19)-(20) as discussed above for recovering the horizontal and vertical permeabilities $k_{sh}^h$ and $k_{sh}^v$ of a pure shale formation. With a known laminar shale volume $V_{lam}$, equations (21) and (22) as discussed above can be solved to obtain the sand permeability $k_{sd}$ in laminated formations.

In other embodiments, resistivity and conventional permeability log data can be used for determining the permeability components in BA formations. The tri-axial resistivity components ($R_x$, $R_y$, and $R_z$) and the effective permeability (or a permeability component), from the previous operations, can be used to determine the tri-axial permeability components ($k_x$, $k_y$, and $k_z$) and permeability anisotropy $$\left(e.g., \frac{k_x}{k_y}, \text{ and } \frac{k_y}{k_z}\right)$$

using, for example, equations (34)-(36) as discussed above.

Once the above data is determined, equation (29) as discussed above can be used to estimate the $C_{RP}$ coefficient. In some embodiments, The resulting data, the calculated $k_h$ and $k_v$ or $k_x$, $k_y$, and $k_z$, and $k_{sd}$ (and $k_{sh}$) can be evaluated for data quality at operation 1310 before output for use in formation evaluation at 1312.

Benefits of the described methods and systems for permeability anisotropy assessment using both MCI data and conventional permeability logs include more accurate reservoir assessment, fracture detection, and oil development/production.

Workflow Validation

Figure 14:
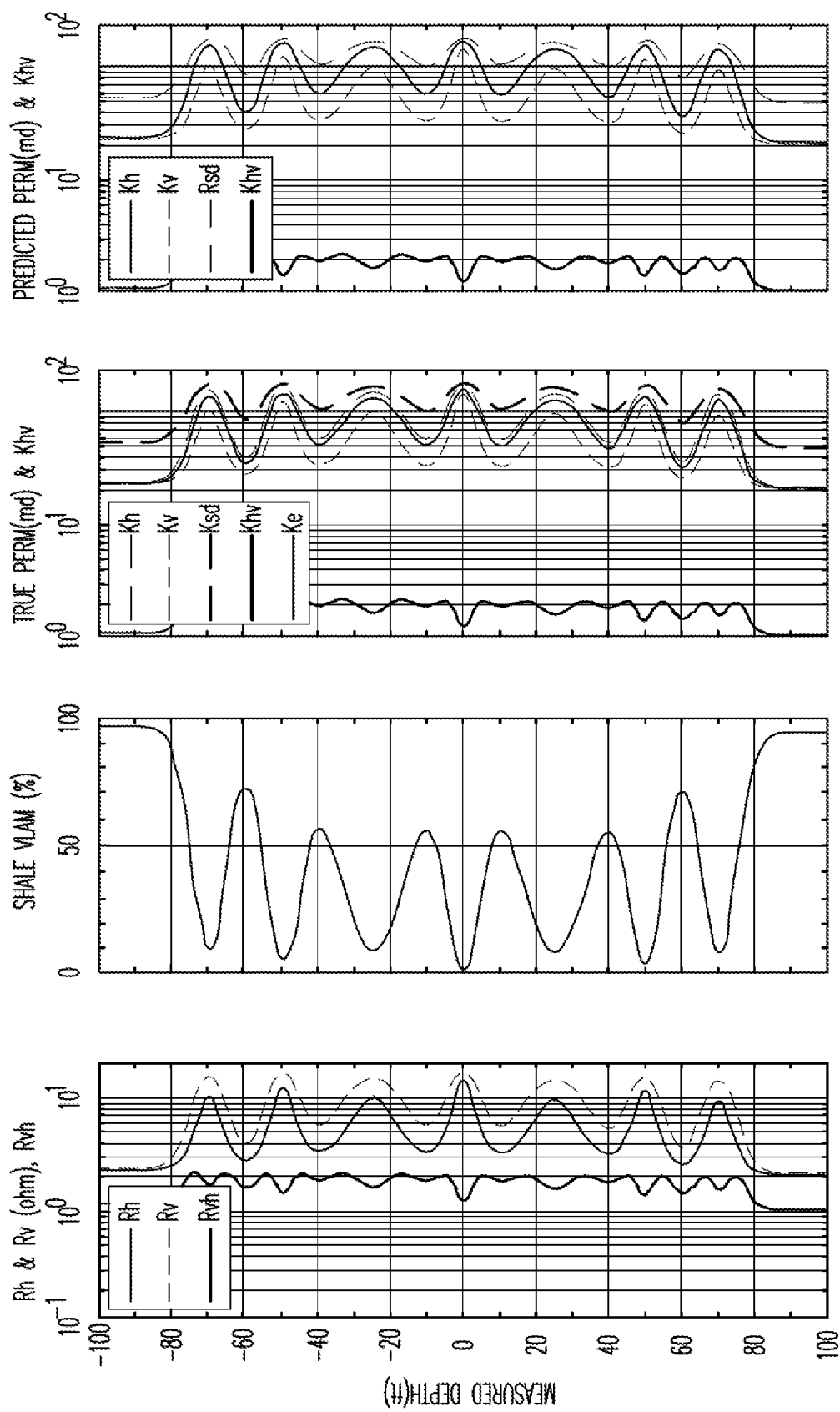
FIG. 14 is a set of plots that provides a synthetic data set without errors for predicting the permeability anisotropy ratio ($k_{hv}$) and the horizontal/vertical permeability components ($k_h$ and $k_v$), according to one or more example embodiments.

FIG. 14 is a set of plots that provides a synthetic data set without errors for predicting the permeability anisotropy ratio ($k_{hv}$) and the horizontal and vertical permeability components ($k_h$ and $k_v$) from an integrated interpretation of $V_{lam}$, $R_v/R_h$, and the effective permeability ($k_e$).

Track 1, the plot illustrated furthest to the left of FIG. 14, illustrates simulated horizontal and vertical resistivity ($R_h$ and $R_v$ having units of ohm-m) over a range of depths. The resistivity anisotropy ($R_{vh}$) is also illustrated in Track 1. $R_h$ and $R_v$ are calculated using equations (26) and (27), as discussed above, for a given $R_{sd}$=10 ohm-m, $R_{sh}^h = R_{sh}^v = 2$ ohm-m, and the known laminar shale volume log $V_{lam}$ is plotted in the adjacent Track 2. The laminar shale volume log $V_{lam}$ is simulated using the below equation:

$$V_{lam}(z,AA,BB) = AA - BB \cdot \Sigma_{i=1}^{N_{sh}} a_i \cdot g_i(z, b_i, c_i), \quad (37)$$

where z represents the logging depth (in units of feet), AA=0.95, BB=0.85, and $N_{sh}$=7.

$g_i(z, b_i, c_i)$ represents multiple, modified Gaussian functions, which can be expressed using the below equation:

$$g_i(z, b_i, c_i) = e^{-\frac{1}{2}\left(\frac{z-b_i}{c_i}\right)^2}, i = 1, 2, \ldots, N_{sh} \quad (38)$$

where $a_i$=1, $b_i$=−70, −50, −25, 0, 25, 50, 70, and $c_i$=5, 5, 10, 5, 10, 5, 5.

Track 3 illustrates simulated horizontal/vertical permeability ($k_h/k_v$), effective permeability ($k_e$), and the permeability anisotropy ratio ($k_{hv}=k_h/k_v$) as determined by equations (23), (24), and (18) with a given $k_{sd}$=100 md and $k_{sh}^h = k_{sh}^v = 20$ md, and further with the known $V_{lam}$ from Track 2. Track 4 illustrates the predicted horizontal/vertical permeability ($k_h/k_v$), sand permeability ($k_{sd}$), and the permeability anisotropy ratio ($k_{hv}=k_h/k_v$) using the workflow described in FIG. 13.

Due to the permeability macro-anisotropy caused by laminations and the limitation of tool vertical resolution, the effective permeability $k_e$ from conventional logs is not the same as $k_h$ and $k_v$. Further, it can be seen that all of $k_e$, $k_h$ and $k_v$ are significantly different from the $k_{sd}$ log for the same lamination reason. However, by comparing Tracks 3 and 4, it can be seen that the predicted $k_h$ & $k_v$, $k_{sd}$, and $k_{hv}$ in Track 4 are all identical to their true values in Track 3.

Figure 15:
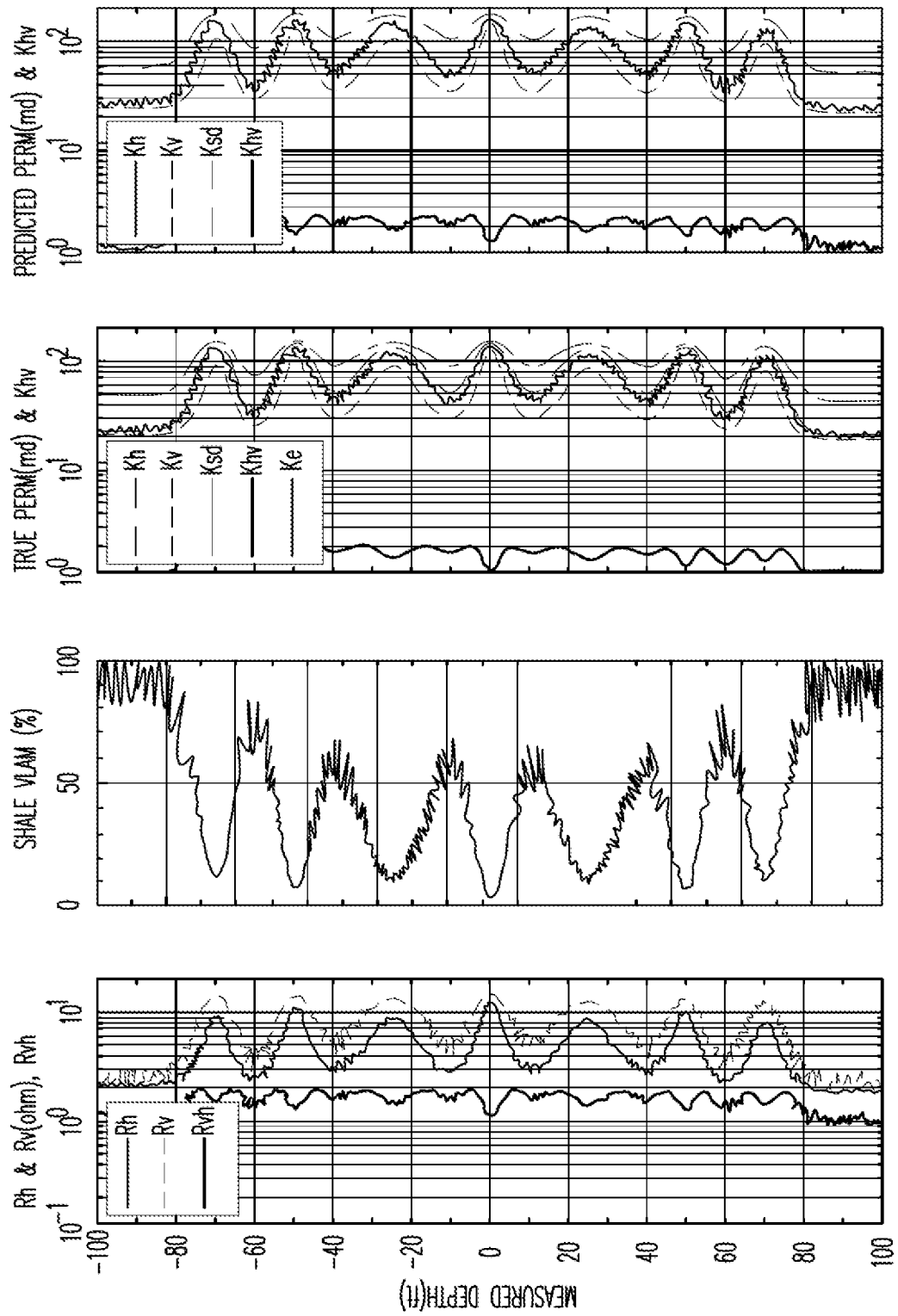
FIG. 15 is a set of plots that provides a synthetic data set with a maximum random error of ±20% for predicting the permeability anisotropy ratio ($k_{hv}$) and the horizontal/vertical permeability components ($k_h$ and $k_v$), according to one or more example embodiments.

FIG. 15 is a set of plots that provides a synthetic data set with a maximum random error of ±20% for predicting the permeability anisotropy ratio ($k_{hv}$) and the horizontal/vertical permeability components ($k_h$ and $k_v$) from an integrated interpretation of $V_{lam}$, $R_v/R_h$, and the effective permeability ($k_e$). The laminar shale volume log $V_{lam}$ is simulated with random error using the below equation:

$$V_{lam}^{err}(z,AA,BB) = (1+0.2*[2*randomErr-1])*V_{lam}(z, AA,BB) \quad (38)$$

where randomErr is a random error generated by computer (e.g., 0.0≤randomErr≤1.0). From the above, it is known that the max error is 20%.

Track 1, the plot illustrated furthest to the left of FIG. 15, illustrates simulated horizontal and vertical resistivity ($R_h$ and $R_v$ having units of ohm-m) over a range of depths. The resistivity anisotropy ($R_{vh}$) is also illustrated in Track 1. $R_h$ and $R_v$ are calculated using equations (26) and (27), as discussed above, for a given $R_{sd}$=10 ohm-m, $R_{sh}^h = R_{sh}^v = 2$ ohm-m, and the known laminar shale volume log $V_{lam}$ is plotted in the adjacent Track 2. Track 3 illustrates simulated horizontal/vertical permeability ($k_h/k_v$), effective permeability ($k_e$), and the permeability anisotropy ratio ($k_{hv}=k_h/k_v$) as determined by equations (23), (24), and (18) with a given $k_{sd}$=100 md and $k_{sh}^h = k_{sh}^v = 20$ md, and further with the known $V_{lam}$ from Track 2. Track 4 illustrates the predicted horizontal/vertical permeability ($k_h/k_v$), sand permeability ($k_{sd}$), and the permeability anisotropy ratio ($k_{hv}=k_h/k_v$) using the workflow described in FIG. 13. Even though the data set of FIG. 15 includes error (as opposed to FIG. 14), it can be seen that the predicted permeability data obtained in Track 4 still compares well relative to the true values shown in Track 3.

Figure 16:
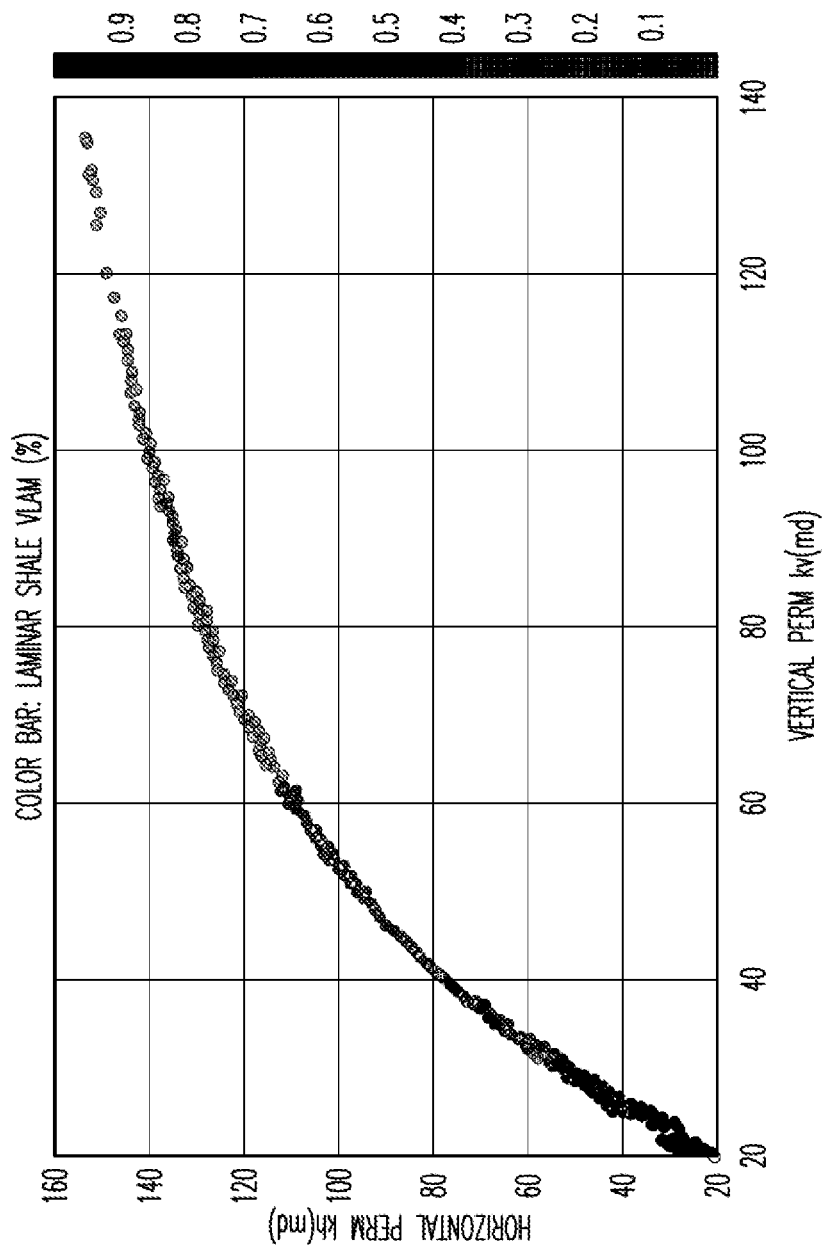
FIG. 16 is a cross plot for $k_h$ vs $k_v$ vs $V_{lam}$, according to one or more example embodiments.

Referring now to FIG. 16, a cross plot is illustrated for $k_h$ vs $k_v$ vs $V_{lam}$ for the data set shown in FIG. 15. From the cross-plot the shale permeability $k_{sh}$ can be determined using the highest $V_{lam}$. It can be observed that the shale is isotropic and has a permeability of $k_{sh}$=20 md.

Example System

Figure 17:
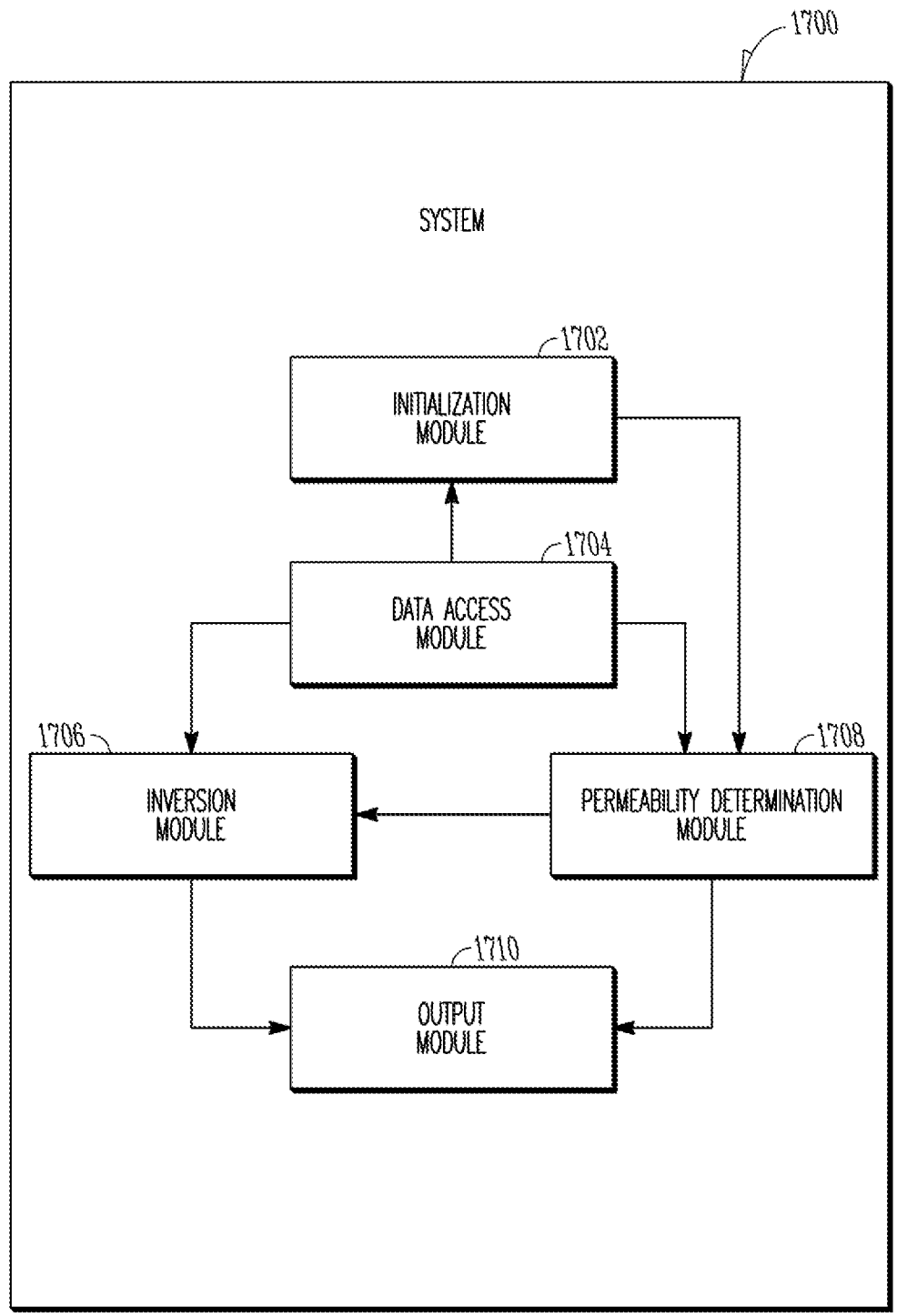
FIG. 17 is a schematic block diagram of a system for permeability determination, according to one or more example embodiments.

FIG. 17 is a schematic block diagram of an example system 1700 for estimating subsurface formation and invasion properties, according to an example embodiment. The example system 1700 of FIG. 17 may be configured to perform one or more of the methods described above with reference to FIG. 13. The system 1700 is described in terms of a number of modules for performing the respective operations previously described. As used herein a "module" can be an engine, logic component, or mechanism capable of performing described operations and/or configured or arranged in a certain manner. Modules may constitute either software modules, with code embodied on a non-transitory machine-readable medium (i.e., such as any conventional storage device, such as volatile or non-volatile memory, disk drives or solid state storage devices (SSDs), etc.), or hardware-implemented modules. In certain example embodiments, one or more computer systems (e.g., a standalone, client, or server computer system) or one or more components of a computer system (e.g., a processor or a group of processors) may be configured by software (e.g., an application or application portion) or firmware (note that software and firmware can generally be used interchangeably herein as is known by a skilled artisan) as a module that operates to perform the described operations.

In various embodiments, a hardware-implemented module may be implemented mechanically or electronically. A hardware-implemented module is a tangible unit capable of performing certain operations and may be configured or arranged in a certain manner. In example embodiments, one or more computer systems (e.g., a standalone, client, or server computer system) or one or more processors may be configured by software (e.g., an application or application portion) as a hardware-implemented module that operates to perform certain operations as described herein. For example, a hardware-implemented module may include dedicated circuitry or logic that is permanently configured (e.g., within a special-purpose processor, application specific integrated circuit (ASIC), or logic array) to perform the identified operations. A hardware-implemented module may also include programmable logic or circuitry (e.g., as encompassed within a general-purpose processor or other programmable processor) that is temporarily configured by software or firmware to perform some or all of such operations.

The term "hardware-implemented module" should be understood to encompass a tangible entity, be that an entity that is physically constructed, permanently configured (e.g., hardwired), or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation and store the output of that operation in a memory device to which it is communicatively coupled. A further hardware-implemented module may then, at a later time, access the memory device to retrieve and process the stored output. Hardware-implemented modules may also initiate communications with input or output devices, and can operate on a resource (e.g., a collection of information).

Accordingly, the term "module" should be understood to encompass a tangible entity, be that an entity that is physically constructed, permanently configured (e.g., hardwired), non-transitory, or temporarily configured (e.g., programmed) to operate in a certain manner or to perform certain operations described herein. In some embodiments, modules or components may temporarily configured (e.g., programmed); and each of the modules or components need not be configured or instantiated at any one instance in time. For example, where the modules or components include a general-purpose processor configured using software, the general-purpose processor may be configured as respective different modules at different times. Software may accordingly configure the processor to constitute a particular module at one instance of time and to constitute a different module at a different instance of time.

Modules can provide information to, and receive information from, other modules. Accordingly, the described modules may be regarded as being communicatively coupled. Where multiples of such modules exist contemporaneously, communications may be achieved through signal transmission (e.g., over appropriate circuits and buses) that connect the modules. In embodiments in which multiple modules are configured or instantiated at different times, communications between such modules may be achieved, for example, through the storage and retrieval of information in memory structures to which the multiple modules have access. For example, one module may perform an operation and store the output of that operation in a memory device to which it is communicatively coupled. A further module may then, at a later time, access the memory device to retrieve and process the stored output. Modules may also initiate communications with input or output devices and can operate on a resource (e.g., a collection of information).

For purposes of the present description, the modules of FIG. 17 will be described in terms of the algorithms executed in each module, as may be executed by one or more processors, general purpose computer or other mechanism based on instructions stored in hardware in accordance with the description above.

In this example embodiment, the system 1700 includes a data access module 1704 configured to access MCI and other logging data from an initialization module 1702. An inversion module 1706 is configured to perform inversion in accordance with one or more of the example embodiments discussed with reference to FIG. 13, while a permeability determination module 1708 is configured to determine one or more permeability anisotropy components based on results of the inversion, according to the permeability anisotropy models and/or formulas discussed above. In some embodiments, the inversion module 1706 can be configured to perform the inversion processing as described herein. In one embodiment, the inversion module 1706 can be configured to calculate inverted TI parameters by performing an iterative inversion operation on the MCI data using a TI formation model that represents simulated formation resistivity characteristics that account for transverse formation isotropy to resistivity in the manner described herein. In other embodiments, the can be configured to calculate inverted BA parameters by performing an iterative inversion operation on the MCI data using a BA formation model that represents simulated formation resistivity characteristics that account for transverse biaxial formation anisotropy to resistivity in the manner described herein.

After inversion processing, the permeability determination module 1708 can perform permeability anisotropy calculations as described herein. The system 1700 further comprises an output module 1710 configured to deliver the calculated permeability components. The output module 1710 may in some embodiments deliver numerical tables with estimated values for formation resistivity, laminar shale volume, and/or various permeability components and invasion resistivity at multiple different points along a borehole. In other embodiments, a graphical plot that maps the estimated values to the borehole positions may be printed in hard copy, and/or may be displayed on a display screen (e.g., video display unit 1810 as further described below in reference to FIG. 18).

Example Machine Architecture and Machine-Readable Medium

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., Application Program Interfaces (APIs).)

Figure 18:
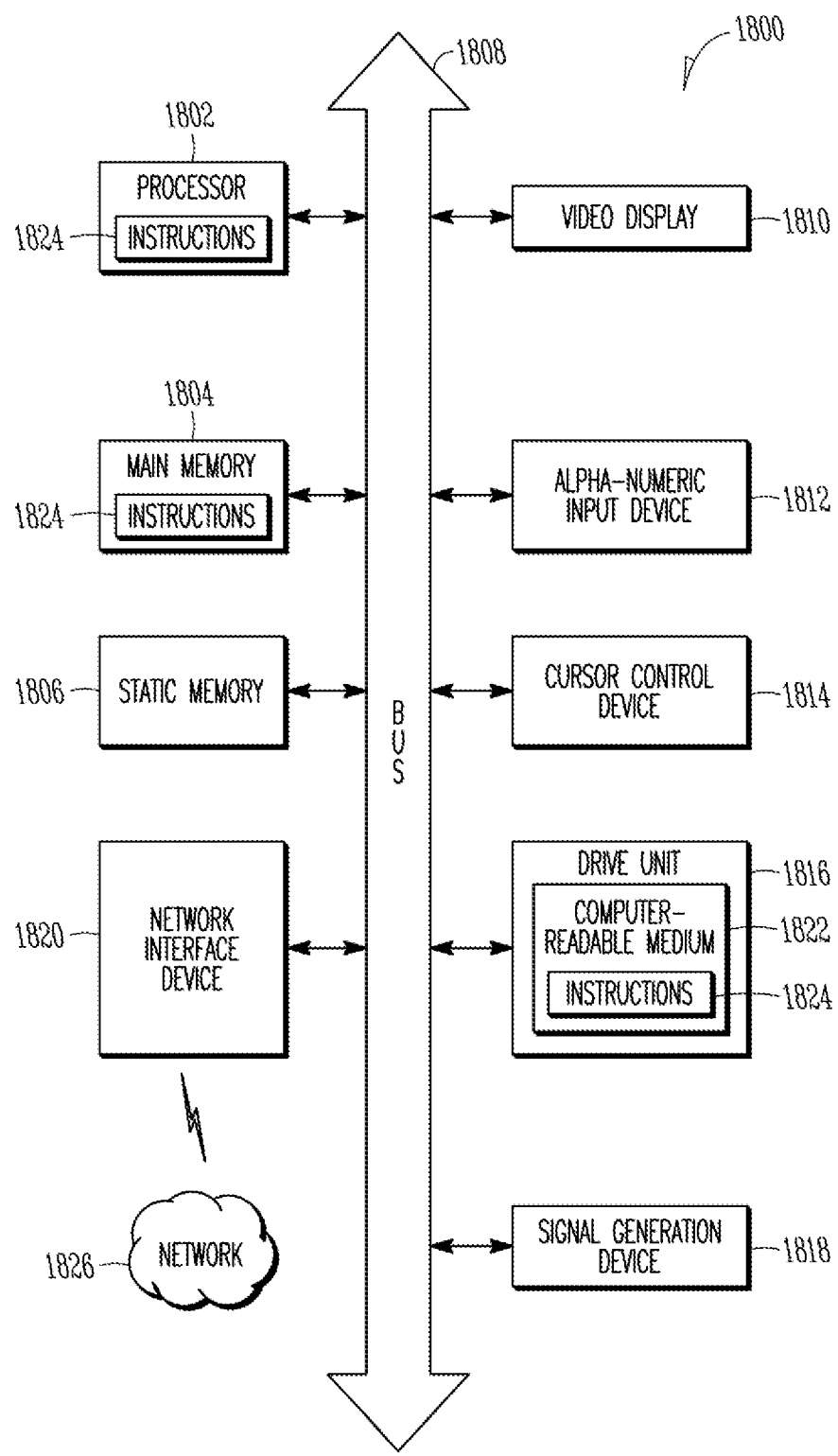
FIG. 18 is a diagrammatic representation of a machine in the example form of a computer system within which a set of instructions for causing the machine to perform a method for permeability determination may be executed, according to one or more example embodiments.

FIG. 18 is a diagrammatic representation of a machine in the example form of a computer system 1800 within which a set of instructions 1824 may be executed for causing the machine to perform any one or more of the methodologies discussed herein. For example, the surface computer system 366 (FIG. 3) or any one or more of its components may be provided by the system 1800.

In alternative embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1800 includes a processor 1802 (e.g., a central processing unit (CPU) a graphics processing unit (GPU) or both), a main memory 1804 and a static memory 1806, which communicate with each other via a bus 1808. The computer system 1800 may further include a video display unit 1810 (e.g., a liquid crystal display (LCD) or a cathode ray tube (CRT)). The computer system 1800 also includes an alpha-numeric input device 1812 (e.g., a keyboard), a cursor control device 1814 (e.g., a mouse), a disk drive unit 1816, a signal generation device 1818 (e.g., a microphone/speaker) and a network interface device 1820.

The disk drive unit 1816 includes a machine-readable or computer-readable storage medium 1822 on which is stored one or more sets of instructions 1824 (e.g., software) embodying any one or more of the methodologies or functions described herein. The instructions 1824 may also reside, completely or at least partially, within the main memory 1804 and/or within the processor 1802 during execution thereof by the computer system 1800, the main memory 1804 and the processor 1802 also constituting non-transitory machine-readable media. The instructions 1824 may further be transmitted or received over a network 1826 via the network interface device 1820.

While the machine-readable storage medium 1822 is shown in an example embodiment to be a single medium, the term "machine-readable medium" should be taken to include a single medium or multiple media (e.g., a centralized or distributed database and/or associated caches and servers) that store the one or more sets of instructions 1824. The term "machine-readable medium" shall also be taken to include any medium that is capable of storing a set of instructions for execution by the machine and that cause the machine to perform any one or more of the methodologies of this disclosure. The term "machine-readable medium" shall accordingly be taken to include, but not be limited to, solid-state memory devices of all types, as well as optical and magnetic media.

Although this disclosure has been described with reference to specific example embodiments, it will be evident that various modifications and changes may be made to these embodiments without departing from the broader scope of the disclosure. Accordingly, the specification and drawings are to be regarded in an illustrative rather than a restrictive sense.

The following numbered examples are illustrative embodiments in accordance with various aspects of the present disclosure.

1. A method of formation evaluation that includes accessing multicomponent induction (MCI) and permeability data captured by measurement tools in a borehole extending through a subsurface formation; determining inverted resistivity parameters by performing an iterative inversion operation on the MCI data; determining a resistivity anisotropy ratio based at least in part on the inverted resistivity parameters and a permeability anisotropy ratio based at least in part on the formation resistivity anisotropy; determining one or more permeability components based at least in part on the permeability data and permeability-resistivity relationship between the resistivity anisotropy ratio and the permeability anisotropy ratio; and generating a visualization of the one or more permeability components for display on a display device.

2. The method of example 1, further including determining inverted transverse isotropy (TI) parameters by performing an iterative inversion operation on the MCI data.

3. The method of either of examples 1 or 2, in which the iterative inversion operation on the MCI data uses a TI formation model that represents simulated formation resistivity characteristics that account for transverse formation isotropy to resistivity.

4. The method of any of examples 1-3, further including determining inverted biaxial isotropy (BA) parameters by performing an iterative inversion operation on the MCI data.

5. The method of any of examples 1-4, in which the iterative inversion operation on the MCI data uses a BA formation model that represents simulated formation resistivity characteristics that account for transverse biaxial formation anisotropy to resistivity.

6. The method of any of examples 1-5, in which determining one or more permeability components further includes determining biaxial permeability components for a TI anisotropic formation.

7. The method of any of examples 1-6, in which determining one or more permeability components further includes determining triaxial permeability components for a BA anisotropic formation.

8. The method of any of examples 1-7, in which determining one or more permeability components further includes determining permeability anisotropy based at least in part on the one or more permeability components.

9. The method of any of examples 1-8, further including determining horizontal and vertical permeabilities of a shale formation.

10. The method of any of examples 1-9, further including determining true sand permeability in a laminated formation.

11. The method of any of examples 1-10, in which the display device displays one or more permeability components at multiple points along the borehole.

12. A system includes a data access module to access multicomponent induction (MCI) and permeability data captured by measurement tools in a borehole extending through a subsurface formation; an inversion module to calculate inverted resistivity parameters by performing an iterative inversion operation based on the MCI data; a permeability determination module to calculate one or more permeability components based at least in part on the permeability data and the inverted resistivity parameters; and a display device for generating a visualization of the one or more permeability components.

13. The system of example 12, in which the inversion module is further configured to calculate inverted transverse isotropy (TI) parameters by performing an iterative inversion operation on the MCI data using a TI formation model that represents simulated formation resistivity characteristics that account for transverse formation isotropy to resistivity.

14. The system of any of the preceding examples, in which the inversion module is further configured to calculate inverted biaxial anisotropy (BA) parameters by performing an iterative inversion operation on the MCI data using a BA formation model that represents simulated formation resistivity characteristics that account for transverse biaxial formation anisotropy to resistivity.

15. The system of any of the preceding examples, in which the permeability determination module is further configured to determine a resistivity anisotropy ratio based at least in part on the inverted resistivity parameters and a permeability anisotropy ratio based at least in part on the formation resistivity anisotropy.

16. The system of any of the preceding examples, in which the permeability determination module determines the one or more permeability components based at least in part on a permeability-resistivity relationship between the resistivity anisotropy ratio and the permeability anisotropy ratio.

17. The system of any of the preceding examples, in which the permeability determination module is further configured to determine sand permeability in a laminated formation.

18. A computer readable storage medium having stored thereon instructions for causing a machine, in response to execution of the instructions by the machine, to perform operations that include accessing multicomponent induction (MCI) and permeability data captured by measurement tools in a borehole extending through a subsurface formation; determining inverted resistivity parameters by performing an iterative inversion operation on the MCI data; determining a resistivity anisotropy ratio based at least in part on the inverted resistivity parameters and a permeability anisotropy ratio based at least in part on the formation resistivity anisotropy; determining one or more permeability components based at least in part on the permeability data and permeability-resistivity relationship between the resistivity anisotropy ratio and the permeability anisotropy ratio; and generating a visualization of the one or more permeability components for display on a display device.

19. The computer readable storage medium of example 18, in which the instructions are executable to further perform operations including determining horizontal and vertical permeabilities of a shale formation using a multicomponent permeability model including isotropic sands and transversely isotropic shale.

20. The computer readable storage medium of example 18, in which the instructions are executable to further perform operations including determining sand permeability in a laminated formation using a bimodal permeability model.

In this description, references to "one embodiment" or "an embodiment," or to "one example" or "an example," are not intended necessarily to refer to the same embodiment or example; however, neither are such embodiments mutually exclusive, unless so stated or as will be readily apparent to those of ordinary skill in the art having the benefit of this disclosure. Thus, a variety of combinations and/or integrations of the embodiments and examples described herein may be included, as well as further embodiments and examples as defined within the scope of all claims based on this disclosure, and all legal equivalents of such claims.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, disclosed subject matter lies in less than all features of a single disclosed embodiment. Thus, the following claims are hereby incorporated into the Detailed Description, with each claim standing on its own as a separate embodiment.

What is claimed is:

1. A method of formation evaluation, comprising:
accessing multicomponent induction (MCI) and isotropic permeability data captured by measurement tools in a borehole extending through a subsurface formation;
determining inverted resistivity parameters by performing an iterative inversion operation on the MCI data, wherein determining the inverted resistivity parameters comprises calculating inverted biaxial anisotropy (BA) parameters by performing an iterative inversion operation on the MCI data using a BA formation model that represents simulated formation resistivity characteristics that account for transverse biaxial formation anisotropy to resistivity;
determining a resistivity anisotropy ratio based at least in part on the inverted resistivity parameters and a permeability anisotropy ratio based at least in part on the formation resistivity anisotropy;

determining one or more permeability components based at least in part on the isotropic permeability data and permeability-resistivity relationship between the resistivity anisotropy ratio and the permeability anisotropy ratio;

generating a visualization of the one or more permeability components for display on a display device; and operating a controlled device based at least a on the one or more permeability components.

2. The method of claim 1, further comprising:

determining inverted transverse isotropy (TI) parameters by performing an iterative inversion operation on the MCI data.

3. The method of claim 2, wherein the iterative inversion operation on the MCI data uses a TI formation model that represents simulated formation resistivity characteristics that account for transverse formation isotropy to resistivity.

4. The method of claim 1, wherein the iterative inversion operation on the MCI data uses a BA formation model that represents simulated formation resistivity characteristics that account for transverse biaxial formation anisotropy to resistivity.

5. The method of claim 1, wherein determining one or more permeability components further comprises determining biaxial permeability components for a TI anisotropic formation.

6. The method of claim 1, wherein determining one or more permeability components further comprises determining triaxial permeability components for a BA anisotropic formation.

7. The method of claim 1, wherein determining one or more permeability components further comprises determining permeability anisotropy based at least in part on the one or more permeability components.

8. The method of claim 1, further comprising:

determining horizontal and vertical permeabilities of a shale formation.

9. The method of claim 1, further comprising:

determining true sand permeability in a laminated formation.

10. The method of claim 1, wherein the display device displays one or more permeability components at multiple points along the borehole.

11. A system comprising:

a data access module to access multicomponent induction (MCI) and isotropic permeability data captured by measurement tools in a borehole extending through a subsurface formation;

an inversion module to calculate inverted resistivity parameters by performing an iterative inversion operation based on the MCI data;

a permeability determination module to calculate one or more permeability components based at least in part on the isotropic permeability data and the inverted resistivity parameters; and a display device for generating a visualization of the one or more permeability components, wherein the inversion module is further configured to calculate inverted biaxial anisotropy (BA) parameters by performing an iterative inversion operation on the MCI data using a BA formation model that represents simulated formation resistivity characteristics that account for transverse biaxial formation anisotropy to resistivity; and wherein a controlled device is operated based at least in part on the one or more permeability components.

12. The system of claim 11, wherein the inversion module is further configured to calculate inverted transverse isotropy (TI) parameters by performing an iterative inversion operation on the MCI data using a TI formation model that represents simulated formation resistivity characteristics that account for transverse formation isotropy to resistivity.

13. The system of claim 11, wherein the permeability determination module is further configured to determine a resistivity anisotropy ratio based at least in part on the inverted resistivity parameters and a permeability anisotropy ratio based at least in part on the formation resistivity anisotropy.

14. The system of claim 13, wherein the permeability determination module determines the one or more permeability components based at least in part on a permeability-resistivity relationship between the resistivity anisotropy ratio and the permeability anisotropy ratio.

15. The system of claim 11, wherein the permeability determination module is further configured to determine sand permeability in a laminated formation.

16. A non-transitory computer readable storage medium having stored thereon instructions for causing a machine, in response to execution of the instructions by the machine, to perform operations comprising:

accessing multicomponent induction (MCI) and isotropic permeability data captured by measurement tools in a borehole extending through a subsurface formation;

determining inverted resistivity parameters by performing an iterative inversion operation on the MCI data, wherein determining the inverted resistivity parameters comprises calculating inverted biaxial anisotropy (BA) parameters by performing an iterative inversion operation on the MO data using a BA formation model that represents simulated formation resistivity characteristics that account for transverse biaxial formation anisotropy to resistivity;

determining a resistivity anisotropy ratio based at least in part on the inverted resistivity parameters and a permeability anisotropy ratio based at least in part on the formation resistivity anisotropy;

determining one or more permeability components based at least in part on the isotropic permeability data and permeability-resistivity relationship between the resistivity anisotropy ratio and the permeability anisotropy ratio;

generating a visualization of the one or more permeability components for display on a display device; and operating a controlled device based at east in part on the one or more permeability components.

17. The computer readable storage medium of claim 16, wherein the instructions are executable to further perform operations comprising:

determining horizontal and vertical permeabilities of a shale formation using a multi-component permeability model comprising isotropic sands and transversely isotropic shale.

18. The computer readable storage medium of claim 16, wherein the instructions are executable to further perform operations comprising:

determining sand permeability in a laminated formation using a bimodal permeability model.

* * * * *